United States Patent
Iyasu et al.

(10) Patent No.: US 11,418,128 B2
(45) Date of Patent: Aug. 16, 2022

(54) CONTROL APPARATUS FOR ELECTRIC POWER CONVERSION APPARATUS

(71) Applicant: DENSO CORPORATION, Kariya (JP)

(72) Inventors: Seiji Iyasu, Nisshin (JP); Yuji Hayashi, Nisshin (JP); Yuichi Handa, Kariya (JP)

(73) Assignee: DENSO CORPORATION, Kariya (JP)

( * ) Notice: Subject to any disclaimer, the term of this patent is extended or adjusted under 35 U.S.C. 154(b) by 72 days.

(21) Appl. No.: 17/106,283

(22) Filed: Nov. 30, 2020

(65) Prior Publication Data
US 2021/0083594 A1 Mar. 18, 2021

Related U.S. Application Data

(63) Continuation of application No. PCT/JP2019/019507, filed on May 16, 2019.

(30) Foreign Application Priority Data

May 29, 2018 (JP) .............................. JP2018-102642

(51) Int. Cl.
*H02M 7/219* (2006.01)
*H02M 1/12* (2006.01)
(Continued)

(52) U.S. Cl.
CPC ...... *H02M 7/219* (2013.01); *G01R 19/16538* (2013.01); *H02M 1/12* (2013.01); *H03K 5/24* (2013.01); *H02M 1/0009* (2021.05)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 6,917,527 B2 * 7/2005 Takada .................. H02M 3/158
363/16
7,164,591 B2 * 1/2007 Soldano .............. H02M 1/4225
363/89

(Continued)

FOREIGN PATENT DOCUMENTS

JP 2015-198460 A 11/2015
WO WO-2020250442 A1 * 12/2020

*Primary Examiner* — Thienvu V Tran
*Assistant Examiner* — Nusrat Quddus
(74) *Attorney, Agent, or Firm* — Oliff PLC

(57) ABSTRACT

A control apparatus is provided for controlling an electric power conversion apparatus. The electric power conversion apparatus includes a reactor and a drive switch and is configured to convert one of an AC voltage and a DC voltage into the other of the AC voltage and the DC voltage. The control apparatus is configured to: acquire a current detection value that is a detected value of reactor current flowing through the reactor; acquire the AC voltage; calculate, based on the AC voltage, a command value of the reactor current; set a correction value based on the AC voltage; calculate a post-correction current detection value by subtracting the correction value from the current detection value; and operate the drive switch through peak current mode control, thereby controlling the post-correction current detection value to be in agreement with the command value.

4 Claims, 19 Drawing Sheets

(51) Int. Cl.
   *G01R 19/165* (2006.01)
   *H03K 5/24* (2006.01)
   *H02M 1/00* (2006.01)

(58) Field of Classification Search
   CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; G05F 1/30; G05F 1/33; G05F 1/32; G05F 1/34; G05F 1/38; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 5/40; H02M 5/42; H02M 5/453; H02M 7/7575; H02M 5/458; H02M 5/45; H02M 5/4585; H02M 5/4505; H02M 5/451; H02M 5/452; H02M 5/447; H02M 5/456; H02M 1/12; H02M 1/4266; H02M 2001/123; H02M 3/137; H02M 3/28; H02M 3/315; H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875; H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/04; H02M 7/00; H02M 3/07; H02M 7/103; H02M 7/106; H02M 1/088; H02M 2003/071; H02M 2003/072; H02M 3/073; H02M 2003/075; H02M 2003/076; H02M 2003/077; H02M 2003/078; H02M 2001/007; H02M 2001/0048; H02M 3/33507; H02M 3/33546; H02M 1/4208; H02M 7/151; H02M 1/4233; H02M 7/219; H02M 1/08; H02M 7/1552; H02M 7/1557; H02M 7/1623; H02M 7/1626; H02M 1/4225; H02M 3/33592; H02M 7/06; H02M 7/068; H02M 7/064; H02M 1/32; H02M 2001/322; H02M 2001/327; H02M 1/34; H02M 2001/342; H02M 2001/344; H02M 2001/346; H02M 2001/348; H02M 1/36; H02M 1/38; H02M 1/42; H02M 1/4216; H02M 1/4241; H02M 1/425; H02M 1/4258; H02M 2001/4275; H02M 2001/4283; H02M 2001/4291; H05B 39/048; B23K 11/24; H04B 2215/069; H02H 7/261; H02H 7/268; H02J 3/36; H02J 3/01; H02J 7/12
   See application file for complete search history.

(56) References Cited

U.S. PATENT DOCUMENTS

| | | | | |
|---|---|---|---|---|
| 9,554,431 | B2* | 1/2017 | Garrity | H05B 45/39 |
| 10,355,620 | B2* | 7/2019 | Ayai | H03H 7/0115 |
| 2014/0204617 | A1* | 7/2014 | Itou | H02M 7/53871 |
| | | | | 363/17 |
| 2016/0329829 | A1* | 11/2016 | Ayai | H02M 7/5387 |
| 2017/0244317 | A1* | 8/2017 | Kondo | H02M 7/12 |
| 2019/0123661 | A1* | 4/2019 | Iyasu | H02M 7/217 |
| 2019/0229645 | A1* | 7/2019 | Iyasu | H02M 7/5387 |
| 2020/0295689 | A1* | 9/2020 | Tachibana | G03G 15/6558 |
| 2020/0389095 | A1* | 12/2020 | Kajiyama | H02M 1/40 |

* cited by examiner

FIG.9
(a) 1ST EMBODIMENT
(b) COMPARATIVE EXAMPLE
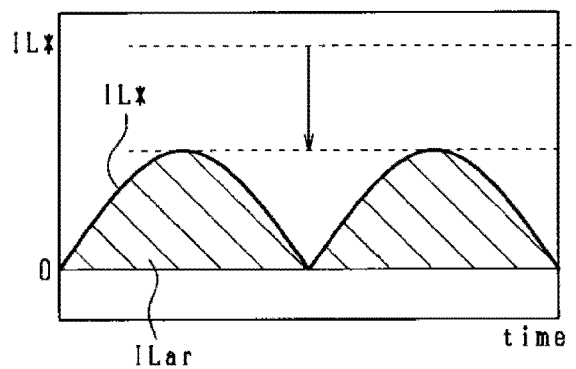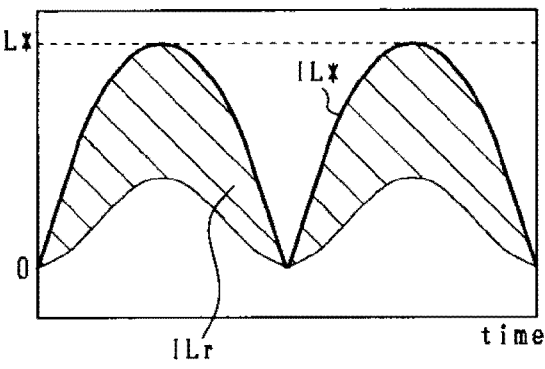
FIG. 10A
1ST EMBODIMENT
FIG. 10B
COMPARATIVE EXAMPLE
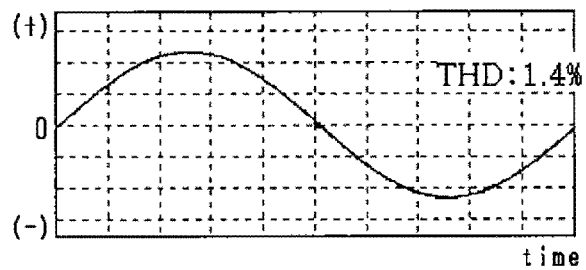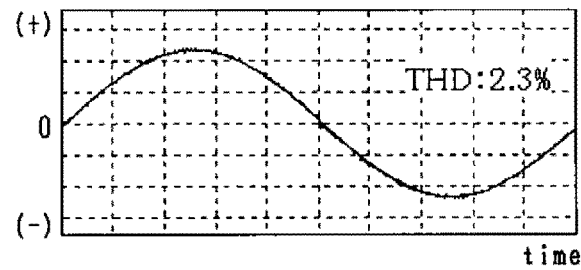

CONTROL APPARATUS FOR ELECTRIC POWER CONVERSION APPARATUS

CROSS-REFERENCE TO RELATED APPLICATIONS

The present application is a continuation application of International Application No. PCT/JP2019/019507 filed on May 16, 2019, which is based on and claims priority from Japanese Patent Application No. 2018-102642 filed on May 29, 2018. The contents of these applications are hereby incorporated by reference in their entirety into the present application.

BACKGROUND

1 Technical Field

The present disclosure relates to control apparatuses for electric power conversion apparatuses.

2 Description of Related Art

There is known an electric power conversion apparatus that includes a reactor and a drive switch. The electric power conversion apparatus is configured to convert an AC voltage into a DC voltage and output the resultant DC voltage. Moreover, a control apparatus applied to the electric power conversion apparatus is configured to operate the drive switch through well-known peak current mode control, so as to control reactor current flowing through the reactor to be in agreement with a command value. Moreover, the control apparatus is configured to adjust, by adding a correction value to the command value, the duty cycle representing the ratio of an ON duration to one switching period of the drive switch, thereby reducing distortion of the AC current.

SUMMARY

According to the present disclosure, there is provided a control apparatus for an electric power conversion apparatus. The electric power conversion apparatus includes a reactor and a drive switch and is configured to convert one of an AC voltage and a DC voltage into the other of the AC voltage and the DC voltage. The control apparatus includes a detection value acquisition unit, an AC voltage acquisition unit, a command value calculation unit, a correction value setting unit, a correction unit and a current control unit. The detection value acquisition unit is configured to acquire a current detection value; the current detection value is a detected value of reactor current flowing through the reactor of the electric power conversion apparatus. The AC voltage acquisition unit is configured to acquire the AC voltage. The command value calculation unit is configured to calculate, based on the AC voltage acquired by the AC voltage acquisition unit, a command value of the reactor current that has a sinusoidal waveform. The correction value setting unit is configured to set a correction value based on the AC voltage acquired by the AC voltage acquisition unit. The correction unit is configured to calculate a post-correction current detection value by subtracting the correction value set by the correction value setting unit from the current detection value acquired by the detection value acquisition unit. The current control unit is configured to operate the drive switch of the electric power conversion apparatus through peak current mode control, thereby controlling the post-correction current detection value calculated by the correction unit to be in agreement with the command value calculated by the command value calculation unit.

BRIEF DESCRIPTION OF THE DRAWINGS

FIG. 9 is an explanatory diagram illustrating advantageous effects achieved by the first embodiment.

FIGS. 10A-10B is another explanatory diagram illustrating advantageous effects achieved by the first embodiment.

DESCRIPTION OF EMBODIMENTS

Figure 1:
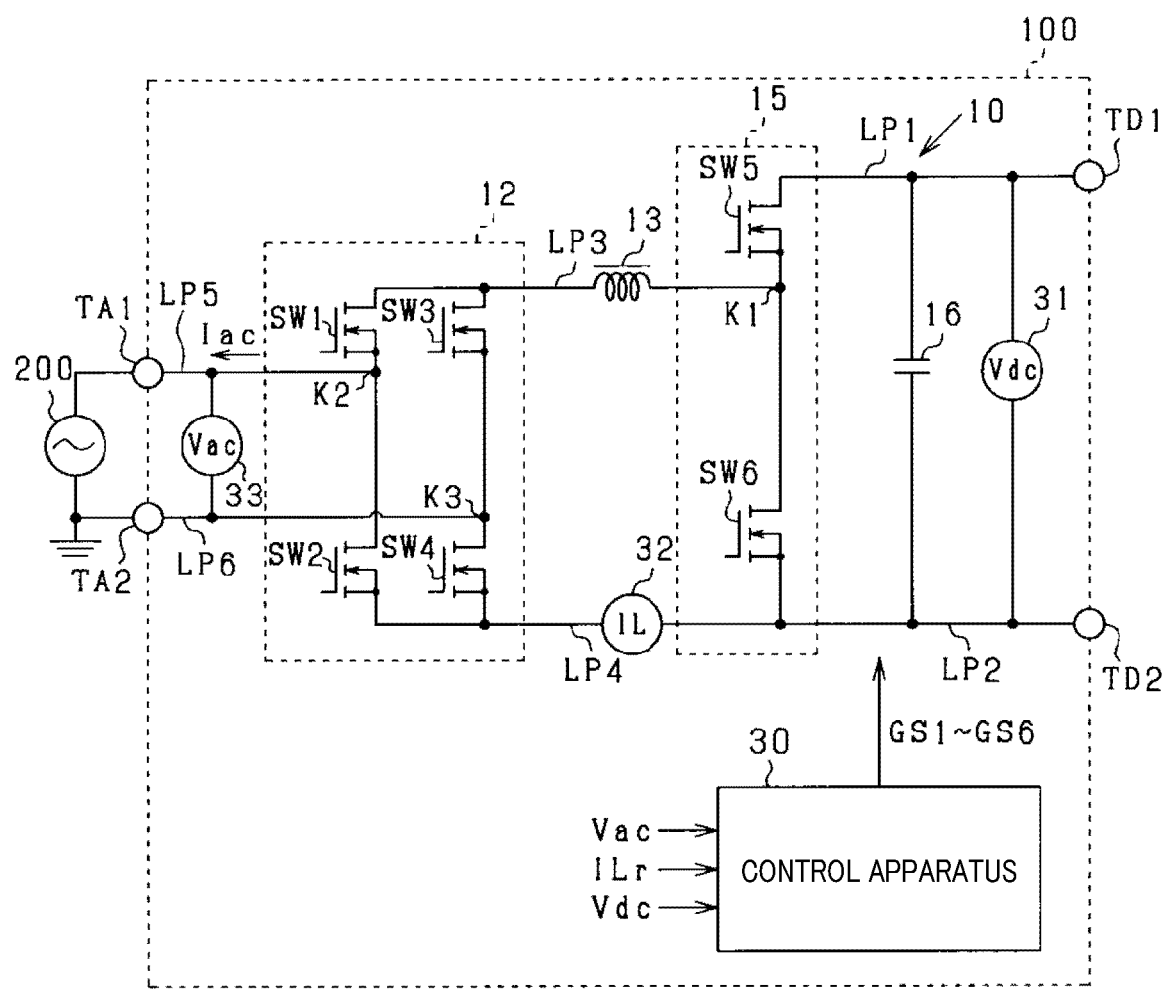
FIG. 1 is a configuration diagram of an electric power conversion apparatus according to a first embodiment.

In the above-described control apparatus applied to the electric power conversion apparatus known in the art (see, for example, Japanese Patent Application Publication No. JP 2015-198460), distortion of the AC current is suppressed by adding the correction value to the command value. In this case, it is necessary to preset the full scale of the control apparatus with respect to the command value to a large value in consideration of the post-correction command value. Consequently, the resolution of the current command value may be lowered by increase in the full scale of the control apparatus.

In contrast, in the above-described control apparatus according to the present disclosure, the current control unit is configured to operate the drive switch of the electric power conversion apparatus through peak current mode control. In the peak current mode control, the duty cycle of the drive switch is set depending on the time for the reactor current to reach the command current in one switching period. Therefore, it is possible to adjust, by adjusting either the command value or the current detection value, the duty cycle of the drive switch, thereby suppressing distortion of the AC current. That is, the inventors of the present application have found that by subtracting a correction value from the current detection value instead of adding a correction value to the command value, it is possible to suppress increase in the full scale of the control apparatus with respect to input signals while adjusting the duty cycle of the drive switch.

In view of the above, in the control apparatus according to the present disclosure, the correction unit is configured to calculate the post-correction current detection value by subtracting the correction value from the current detection value. Moreover, the current control unit is configured to operate the drive switch through peak current mode control, thereby controlling the post-correction current detection value to be in agreement with the command value. Consequently, it becomes possible to suppress increase in the full scale of the control apparatus with respect to input signals while suppressing distortion of the AC current.

Exemplary embodiments will be described hereinafter with reference to the drawings. It should be noted that for the sake of clarity and understanding, identical components having identical functions throughout the whole description have been marked, where possible, with the same reference numerals in the drawings and that for the sake of avoiding redundancy, descriptions of identical components will not be repeated.

First Embodiment

FIG. 1 shows the overall configuration of an electric power conversion apparatus 100 according to the first embodiment. The electric power conversion apparatus 100 is configured to convert a DC voltage into an AC voltage.

Specifically, as shown in FIG. 1, the electric power conversion apparatus 100 includes a DC-to-AC converter (or inverter) 10. The DC-to-AC converter 10 is connected with an AC power supply 200 via a first AC terminal TA1 and a second AC terminal TA2. Moreover, the DC-to-AC converter 10 is also connected with DC machines/devices (not shown) via a first DC terminal TD1 and a second DC terminal TD2. The AC power supply 200 is, for example, a commercial power supply. The DC machines/devices include, for example, at least one of a DC power supply, such as a battery, and a DC-to-DC converter.

The DC-to-AC converter 10 includes a full-bridge circuit 12, a reactor 13, a half-bridge circuit 15, a capacitor 16 and first to sixth wirings LP1-LP6.

The half-bridge circuit 15 includes a fifth switch SW5 and a sixth switch SW6. Each of the fifth and sixth switches SW5 and SW6 is implemented by a voltage-driven switch, more particularly by an N-channel MOSFET (Metal-Oxide-Semiconductor Field-Effect Transistor) in the present embodiment. The source of the fifth switch SW5 is connected with the drain of the sixth switch SW6. Moreover, the drain of the fifth switch SW5 is connected with the first wiring LP1 while the source of the sixth switch SW6 is connected with the second wiring LP2. Furthermore, each of the fifth and sixth switches SW5 and SW6 has a parasitic diode connected in antiparallel thereto. In addition, in the present embodiment, the fifth switch SW5 corresponds to a "drive switch".

A first junction point K1 between the fifth and sixth switches SW5 and SW6 is connected with a first end of the third wiring LP3. Moreover, the reactor 13 is provided in a part of the third wiring LP3. On the other hand, the source of the sixth switch SW6 is connected with a first end of the fourth wiring LP4. Furthermore, each of second ends of the third and fourth wirings LP3 and LP4 is connected with the full-bridge circuit 12.

The full-bridge circuit 12 includes first to fourth switches SW1-SW4. Each of the first to the fourth switches SW1-SW4 is implemented by a voltage-driven switch, more particularly by an N-channel MOSFET in the present embodiment. The source of the third switch SW3 is connected with the drain of the fourth switch SW4. Similarly, the source of the first switch SW1 is connected with the drain of the second switch SW2. Each of the drains of the first and third switches SW1 and SW3 is connected with the third wiring LP3, while each of the sources of the second and fourth switches SW2 and SW4 is connected with the fourth wiring LP4.

A second junction point K2 between the first switch SW1 and the second switch SW2 is connected with a first end of the fifth wiring LP5. Moreover, a second end of the fifth wiring LP5 is connected with the first AC terminal TAL. On the other hand, a third junction point K3 between the third and fourth switches SW3 and SW4 is connected with a first end of the sixth wiring LP6. Moreover, a second end of the sixth wiring LP6 is connected with the second AC terminal TA2.

The capacitor 16 is connected between the first wiring LP1 and the second wiring LP2.

The electric power conversion apparatus 100 also includes a DC voltage sensor 31, a current sensor 32 and an AC voltage sensor 33.

The DC voltage sensor 31 is connected between the first wiring LP1 and the second wiring LP2 to detect the voltage between terminals of the capacitor 16 as a DC voltage Vdc.

The current sensor 32 is provided in the fourth wiring LP4 to detect the reactor current flowing through the reactor 13 as a current detection value ILr.

The AC voltage sensor 33 is connected between the fifth wiring LP5 and the sixth wiring LP6 to detect the voltage of the AC power supply 200 as an AC voltage Vac.

In the present embodiment, the AC current Iac is defined to be positive (or have a positive polarity) when it flows in a direction from the first AC terminal TA1 to the full-bridge circuit 12 and be negative (or have a negative polarity) when it flows in a direction from the second AC terminal TA2 to the full-bridge circuit 12. Moreover, to distinguish the current actually flowing through the reactor 13 from the current detection value ILr, the current actually flowing through the reactor 13 will be referred to as the reactor current IL hereinafter.

The electric power conversion apparatus 100 further includes a control apparatus 30. Various functions of the control apparatus 30 may be realized, for example, by software stored in a tangible memory device and a computer that executes the software, by hardware, or by a combination of the aforementioned means.

Figure 2:
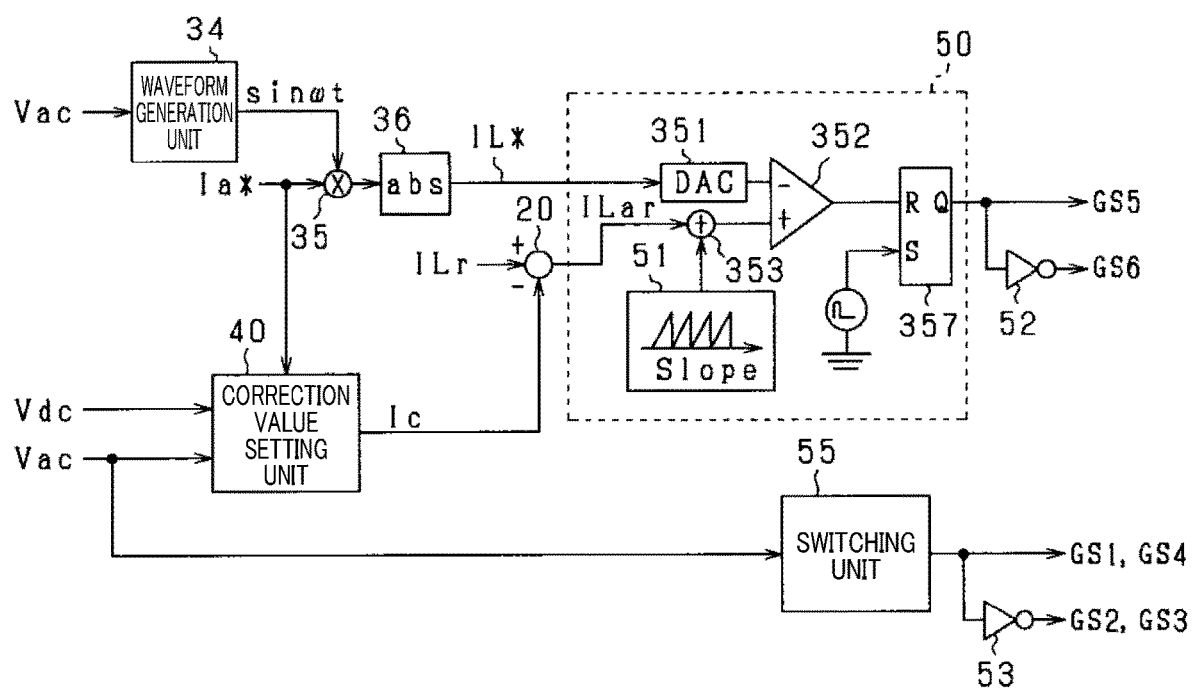
FIG. 2 is a functional block diagram of a control apparatus applied to the electric power conversion apparatus according to the first embodiment.

FIG. 2 is a functional block diagram illustrating functions of the control apparatus 30 according to the present embodiment. The control apparatus 30 operates, through peak current mode control, the fifth switch SW5 to be in an OFF state or an ON state. In the present embodiment, the control apparatus 30 includes a waveform generation unit 34, a multiplier 35, an absolute value calculation unit 36, a correction value setting unit 40, a current control unit 50 and a correction unit 20. In addition, in the present embodiment, the waveform generation unit 34, the multiplier 35 and the absolute value calculation unit 36 together correspond to a "command value calculation unit".

The waveform generation unit 34 generates a reference waveform sin ωt that represents voltage change in a half period (T/2) of the AC power supply 200. For example, the waveform generation unit 34 first detects timings at which the AC voltage Vac detected by the AC voltage sensor 33 becomes 0 as zero-crossing timings; then the waveform generation unit 34 sets the time period during which the AC voltage Vac changes from a zero-crossing timing to a next zero-crossing timing as a half period (T/2) of the AC power supply 200. Thereafter, the waveform generation unit 34 calculates the angular velocity ω of the AC power supply 200 by the following equation: ω=2π×(1/T). The waveform generation unit 34 generates, by setting the angular velocity of a sinusoidal signal whose amplitude is equal to 1 to the calculated angular velocity ω, the reference waveform sin ωt that is in phase with the AC voltage Vac.

The multiplier 35 multiplies an amplitude command value Ia* and the reference waveform sin ωt together. The amplitude command value Ia* is a command value for prescribing the amplitude of the reactor current flowing through the reactor 13. The amplitude command value Ia* is set, for example, based on a command value of the AC voltage Vac that is the output voltage.

The absolute value calculation unit 36 calculates the absolute value |Ia*×sin ωt| of the output from the multiplier 35 and sets command current IL* to the calculated absolute value |Ia*×sin ωt|. In addition, in the present embodiment, the command current IL* corresponds to a "command value of the reactor current".

The correction value setting unit 40 sets a current correction value Ic for correcting the current detection value ILr. The current correction value Ic is a correction value for suppressing distortion of the AC current Iac.

The correction unit 20 corrects the current detection value ILr with the current correction value Ic and outputs the corrected detection value to the current control unit 50. Hereinafter, the detection value corrected by the correction unit 20 will be referred to as the post-correction current detection value ILar.

The current control unit 50 outputs, based on the post-correction current detection value ILar and the command current IL*, a fifth gate signal GS5 for operating the fifth switch SW5. More particularly, in the present embodiment, the current control unit 50 outputs the fifth gate signal GS5 through well-known peak current mode control.

The current control unit 50 includes a DA converter (abbreviated to DAC in FIG. 2) 351, a comparator 352, an adder 353, an RS flip-flop 357 and a slope-amount setting unit 51. The DA converter 351 converts the command current IL* from a digital form into an analog form. Then, the command current IL* converted into the analog form is inputted to an inverting input terminal of the comparator 352. The adder 353 adds the post-correction current detection value ILar and a slope compensation signal Slope set by the slope-amount setting unit 51. The output from the adder 353 is inputted to a non-inverting input terminal of the comparator 352. In addition, the slope compensation signal Slope is for suppressing oscillation accompanying fluctuation of the current flowing through the reactor 13.

The comparator 352 compares the command current IL* inputted to the inverting input terminal thereof with the slope-compensated post-correction current detection value ILar inputted to the non-inverting input terminal thereof. When the slope-compensated post-correction current detection value ILar is smaller than the command current IL*, the comparator 352 outputs a low-level signal to an R terminal of the RS flip-flop 357. In contrast, when the slope-compensated post-correction current detection value ILar is larger than the command current IL*, the comparator 352 outputs a high-level signal to the R terminal of the RS flip-flop 357.

On the other hand, a clock signal is inputted to an S terminal of the RS flip-flop 357. The time period from an ON timing at which the clock signal is switched to the high level (or ON state) to a next ON timing at which the clock single is again switched to the high level is equal to one switching period Tsw.

The current control unit 50 has an output terminal connected with the gate of the fifth switch SW5 and outputs the fifth gate signal GS5 to the gate of the fifth switch SW5 via the output terminal. Moreover, the output terminal of the current control unit 50 is also connected with the gate of the sixth switch SW6 via a phase inverter 52. The signal outputted from the output terminal of the current control unit 50 to the gate of the sixth switch SW6 via the phase inverter 52 constitutes a sixth gate signal GS6 for operating the sixth switch SW6.

The switching unit 55 determines whether the AC voltage Vac is positive or negative. Further, the switching unit 55 sets its output signal to a high level when the AC voltage Vac is determined to be positive, and to a low level when the AC voltage Vac is determined to be negative. The switching unit 55 is connected with each of the gates of the first and fourth switches SW1 and SW4. The switching unit 55 outputs a first gate signal GS1 for operating the first switch SW1 and a fourth gate signal GS4 for operating the fourth switch SW4 respectively to the gates of the first and fourth switches SW1 and SW4. Moreover, the switching unit 55 is also connected with each of the gates of the second and third switches SW2 and SW3 via a phase inverter 53. The switching unit 55 outputs, via the phase inverter 53, a second gate signal GS2 for operating the second switch SW2 and a third gate signal GS3 for operating the third switch SW3 respectively to the gates of the second and third switches SW2 and SW3.

Consequently, the first and fourth gate signals GS1 and GS4 are in inverse relation to the second and third gate signals GS2 and GS3.

Figure 3:
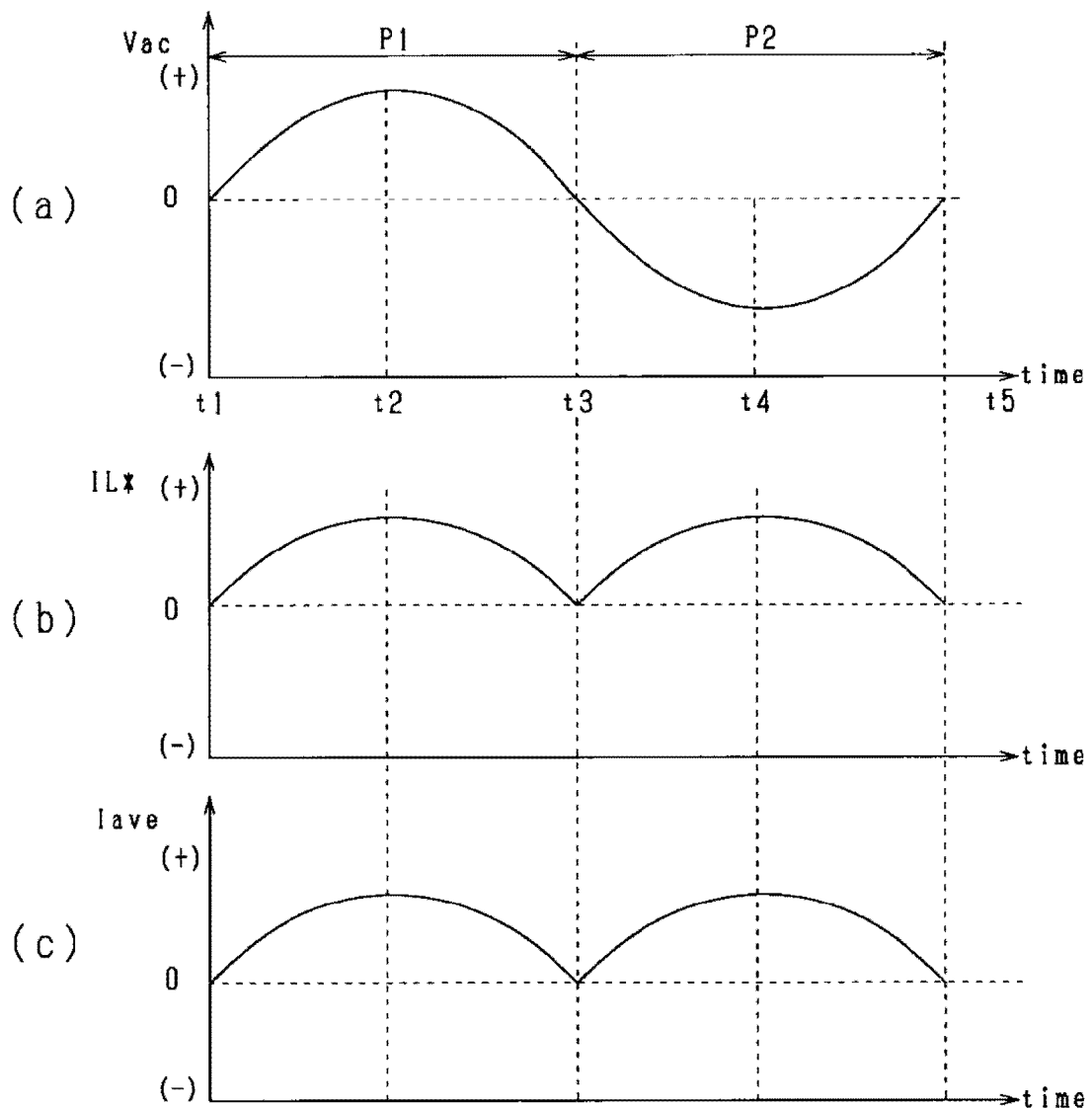
FIG. 3 is a time chart illustrating the changes with time of an AC voltage, command current and an average value of reactor current in the electric power conversion apparatus according to the first embodiment.

FIG. 3 illustrates (a) the change with time of the AC voltage Vac, (b) the change with time of the command current IL* and (c) the change with time of the average value Iave of the reactor current in the case of the power factor being equal to 1.

As shown in FIGS. 3(a) and (b), the command current IL* changes with time such that positive halves of a sine wave representing the command current IL* repeat in phase with the change of the AC voltage Vac. Moreover, as shown in FIG. 3(c), similar to the command current IL*, the average value Iave of the reactor current without distortion also changes with time such that positive halves of a sine wave representing the average value Iave repeat in phase with the change of the AC voltage Vac.

However, in practice, distortion of the reactor current may occur and thus the average value Iave of the reactor current may not have the waveform as shown in FIG. 3(c). In the peak current mode control, distortion of the AC current Iac occurs when the reactor current does not have a suitable value. Specifically, when the DC-to-AC converter 10 converts the DC voltage Vdc into the AC voltage Vac, the deviation between the average value Iave of the reactor current with distortion occurring therein and the command current IL* becomes smallest in the vicinities of the zero-crossing timings (t1, t3, t5) of the AC voltage Vac. Moreover, the deviation becomes largest in the vicinities of the peak timings (t2, t4) of the AC voltage Vac. Therefore, the control apparatus 30 sets, according to the change tendency of the deviation, the duty cycle (Ton/Tsw) representing the ratio of an ON duration (or ON-operation period) to one switching period of the fifth switch SW5, thereby suppressing distortion of the reactor current.

More specifically, in the peak current mode control, the duty cycle of the fifth switch SW5 is set depending on the time for the slope-compensated post-correction current detection value ILar to reach the command current IL* in one switching period Tsw. Therefore, it is possible to adjust, by adjusting either the command current IL* or the current detection value ILr, the duty cycle of the fifth switch SW5, thereby suppressing distortion of the reactor current. Moreover, in the case of adjusting the duty cycle of the fifth switch SW5 by adding a correction value to the command current IL*, the full scale (or full range) of the comparator 352, to which the post-correction command current IL* is inputted, would be increased by an amount corresponding to the correction value. Consequently, with increase in the full scale of the comparator 352, the resolution of the comparator 352 and thus the S/N ratio (i.e., Signal-to-Noise ratio) of the command current IL* might be lowered.

On the other hand, the duty cycle of the fifth switch SW5 may also be adjusted by subtracting a correction value from the current detection value ILr instead of adding a correction value to the command current IL*. In this case, neither the command current IL* nor the current detection value ILr increases; consequently, it is possible to suppress increase in the full scale of the comparator 352.

In view of the above, in the present embodiment, to suppress increase in the full scale of the comparator 352, the correction unit 20 outputs the result of subtracting the current correction value Ic from the current detection value ILr to the comparator 352.

Figure 4:
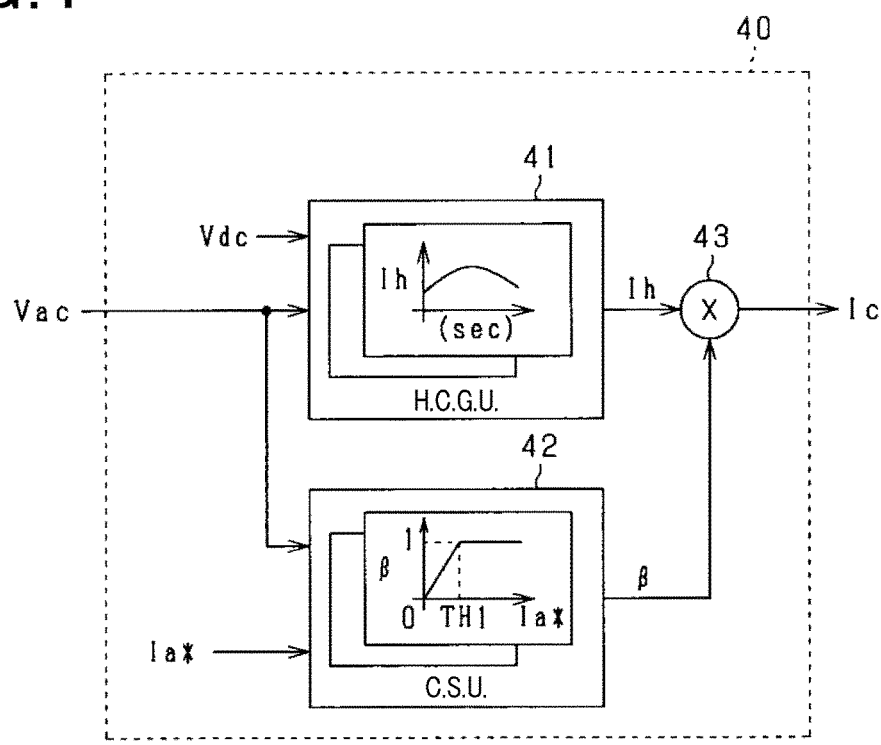
FIG. 4 is a configuration diagram of a correction value setting unit of the control apparatus according to the first embodiment.

Next, referring to FIG. 4, the configuration of the correction value setting unit 40 according to the present embodiment will be described. The correction value setting unit 40 includes a harmonic component generation unit (abbreviated to H.C.G.U. in FIG. 4) 41, a coefficient setting unit (abbreviated to C.S.U. in FIG. 4) 42 and a multiplier 43.

Figure 5A:
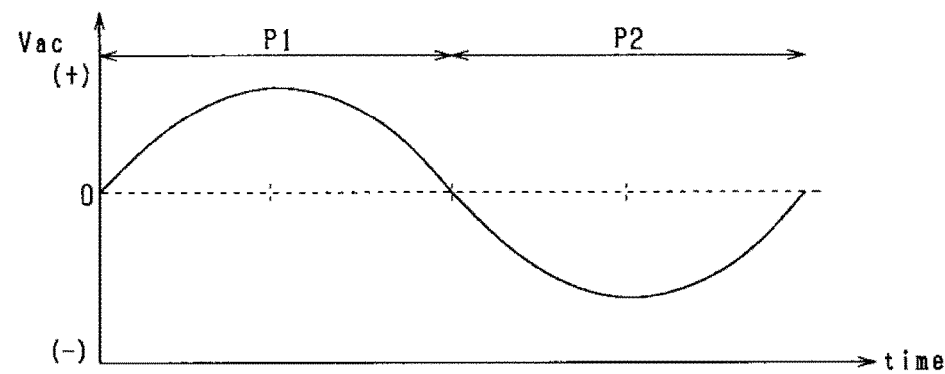
FIGS. 5A-5B is a time chart illustrating the changes with time of the AC voltage and a harmonic correction value set by the correction value setting unit.
Figure 5B:
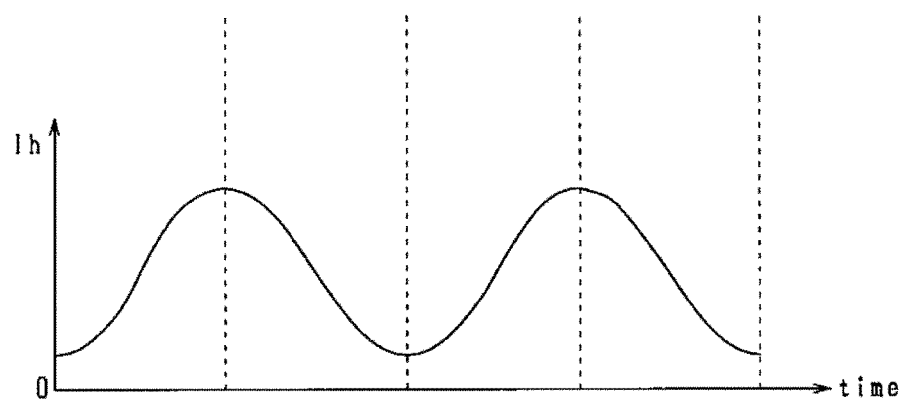

The harmonic component generation unit 41 sets a harmonic correction value Ih based on the AC voltage Vac and the DC voltage Vdc. FIG. 5(a) shows the change with time of the AC voltage Vac and FIG. 5(b) shows the change with time of the harmonic correction value Ih.

In the present embodiment, the harmonic correction value Ih is set to have: a local maximum value at each of a timing in a first period P1 during which the AC voltage Vac is positive and a timing in a second period P2 during which the AC voltage Vac is negative; and a local minimum value at a timing between the timings respectively in the first and second periods P1 and P2 at which it has the local maximum value. More specifically, the harmonic component generation unit 41 sets the harmonic correction value Ih so that the harmonic correction value Ih has a minimum value at each of the zero-crossing timings of the AC voltage Vac and a maximum value at each of the peak timings of the AC voltage Vac.

Moreover, in the present embodiment, the harmonic component generation unit 41 sets the harmonic correction value Ih to be larger than or equal to 0. Furthermore, if the result of subtracting the current correction value Ic from the current detection value ILr was a negative value, it would be necessary to set the full scale of the comparator 352 to cover a negative range. Therefore, in the present embodiment, the harmonic component generation unit 41 sets the harmonic correction value Ih to be smaller than the current detection value ILr expected according to the AC voltage Vac.

In the present embodiment, the control apparatus 30 includes a storage unit (not shown) that is implemented by, for example, a memory. In the storage unit, there is stored a correction value map representing information on the harmonic correction value Ih associated with the AC voltage Vac and the DC voltage Vdc. Therefore, it is possible for the harmonic component generation unit 41 to set, by referring to the correction value map, the harmonic correction value Ih according to the AC voltage Vac and the DC voltage Vdc.

In addition, in the storage unit, there may be stored one correction value map for each of the root-mean-square values of commercial power supplies of different countries. In this case, it is possible for the harmonic component generation unit 41 to first determine the root-mean-square value Vrms based on the maximum value of the AC voltage Vac and then refer to the correction value map corresponding to the determined root-mean-square value Vrms.

Referring back to FIG. 4, the coefficient setting unit 42 sets, based on the amplitude command value Ia* and the AC voltage Vac, a coefficient β by which the harmonic correction value Ih is to be multiplied. In the present embodiment, the coefficient β is set to be larger than 0 and smaller than or equal to 1. When the amplitude command value Ia* is small, the reactor current is in a discontinuous mode in which it intermittently flows through the reactor 13; thus the current detection value ILr to be corrected by the current correction value Ic is small. Therefore, when the amplitude command value Ia* is smaller than a threshold value TH1, the coefficient setting unit 42 sets the coefficient β in proportion to the amplitude command value Ia* (i.e., the smaller the amplitude command value Ia*, the smaller the coefficient β is set to be); when the amplitude command value Ia* is larger than or equal to the threshold value TH1, the coefficient setting unit 42 sets the coefficient β to 1. Consequently, when the reactor current is in the discontinuous mode, it is possible to prevent the current detection value ILr from being excessively subtracted, thereby suppressing excessive flow of current through the reactor 13.

In the storage unit of the control apparatus 30, there is also stored a limit value map representing information on the coefficient β associated with the AC voltage Vac and the amplitude command value Ia*. Therefore, it is possible for the coefficient setting unit 42 to set, by referring to the limit value map, the coefficient β according to the AC voltage Vac and the amplitude command value Ia*.

In addition, in the storage unit, there may be stored one limit value map for each of the root-mean-square values of commercial power supplies of different countries. In this case, it is possible for the coefficient setting unit 42 to first determine the root-mean-square value Vrms based on the maximum value of the AC voltage Vac and then refer to the limit value map corresponding to the determined root-mean-square value Vrms.

The multiplier 43 outputs the result of multiplying the harmonic correction value Ih by the coefficient β as the current correction value Ic. Therefore, in the range of the amplitude command value Ia* being smaller than the threshold value TH1, the current correction value Ic is set in proportion to the amplitude command value Ia* (i.e., the smaller the amplitude command value Ia*, the smaller the current correction value Ic is set to be). In contrast, in the range of the amplitude command value Ia* being larger than or equal to the threshold value TH1, the current correction value Ic is set to be equal to the harmonic correction value Ih.

Next, with reference to FIG. 6, explanation will be given of a method of making a correction value map representing the correspondence between the amplitude command value Ia* and the harmonic correction value Ih.

Figure 6:
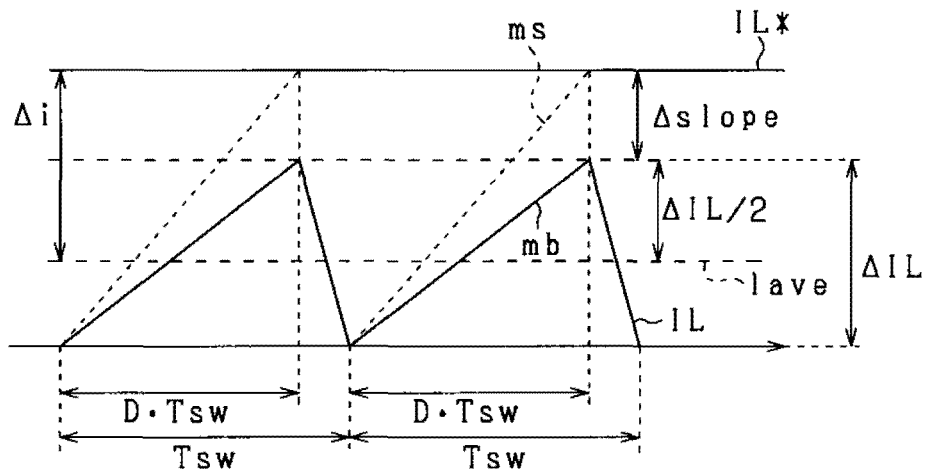
FIG. 6 is an explanatory diagram illustrating the deviation between the average value of the reactor current and the command current in the electric power conversion apparatus according to the first embodiment.

FIG. 6 illustrates a deviation Δi. In the present embodiment, the deviation Δi is defined as the difference between the average value Iave of the reactor current and the command current IL*. Therefore, the deviation Δi is equal to (ΔIL/2+ΔSlope), where ΔIL is the maximum increment of the reactor current in one switching period Tsw and ΔSlope is the maximum increment of the slope compensation signal Slope. In addition, ΔIL/2 represents the difference between the maximum value and the average value Iave of the reactor current. Moreover, in the present embodiment, the deviation Δi is set as the harmonic correction value Ih. The harmonic correction value Ih can be calculated by the following equation (1):

$$\Delta i = = Ih = = mb \times D \; Tsw/2 + ms \times D \times Tsw \quad (1)$$

where mb the slope of increase of the reactor current, ms is a slope amount representing the slope of the slope compensation signal Slope, and D is the duty cycle of the fifth switch SW5.

The slope mb of increase of the reactor current satisfies the relationship of (mb=(Vdc−|Vac|)/L). The harmonic correction value Ih can be calculated by the following equation (2) that is obtained by substituting the above relationship into the equation (1).

$$Ih = \frac{Vdc - |Vac|}{2L} \cdot D \cdot Tsw + ms \cdot D \cdot Tsw \quad (2)$$

When the electric power conversion apparatus 100 converts the DC voltage into the AC voltage, the duty cycle D can be calculated by the following equation (3).

$$D = \frac{|Vac|}{Vdc} \quad (3)$$

In the present embodiment, the harmonic correction value Ih is calculated, by the above equations (2) and (3), for various combinations of the AC voltage Vac and the DC voltage Vdc. Moreover, the correction value map is made by associating the calculated harmonic correction value Ih with each combination of the AC voltage Vac and the DC voltage Vdc.

Figure 7:
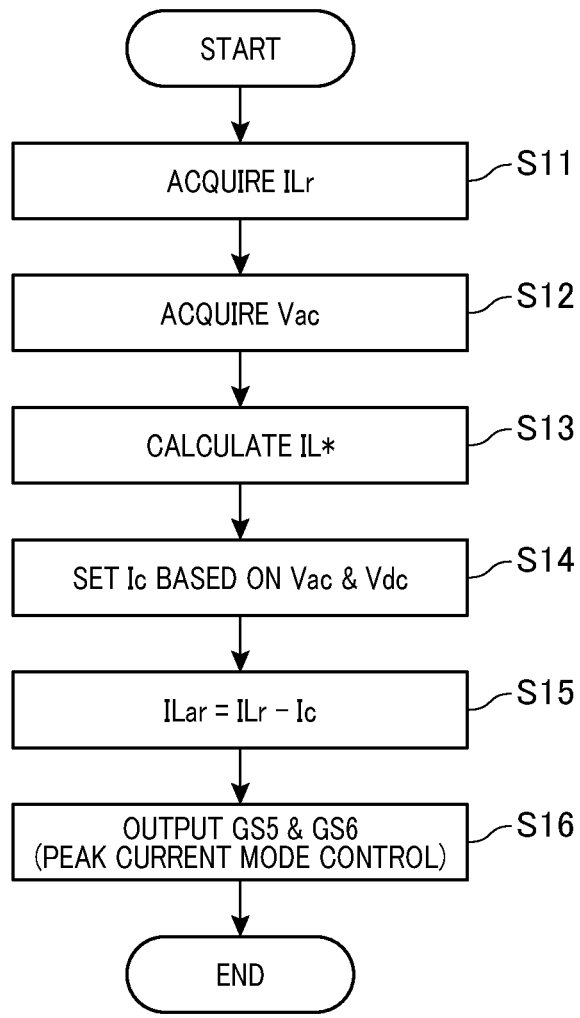
FIG. 7 is a flow chart illustrating a process performed by the control apparatus according to the first embodiment for operating a fifth switch through peak current mode control.

Next, with reference to FIG. 7, explanation will be given of a process for operating the fifth switch SW5 through the peak current mode control. This process is repeatedly performed by the control apparatus 30 in a predetermined cycle.

First, in step S11, the control apparatus 30 acquires the current detection value ILr detected by the current sensor 32. In addition, step S11 corresponds to a "detection value acquisition unit".

In step S12, the control apparatus 30 acquires the AC voltage Vac detected by the AC voltage sensor 33. In addition, step S12 corresponds to an "AC voltage acquisition unit".

In step S13, the control apparatus 30 calculates the command current IL* as the absolute value of the product of the amplitude command value Ia* and the reference waveform sin ωt of the AC voltage Vac. In addition, step S13 corresponds to the "command value calculation unit".

In step S14, the control apparatus 30 sets, based on the AC voltage Vac and the DC voltage Vdc, the current correction value Ic as described above with reference to FIGS. 4-6. Specifically, the control apparatus 30 first sets the harmonic correction value Ih on the basis of the AC voltage Vac and the DC voltage Vdc and then calculates the current correction value Ic by multiplying the harmonic correction value Ih by the coefficient β.

In step S15, the control apparatus 30 calculates the post-correction current detection value ILar by subtracting the current correction value Ic set in step S14 from the current detection value ILr.

In step S16, the control apparatus 30 outputs, as described above with reference to FIG. 2, the fifth and sixth gate signals GS5 and GS6 for performing the peak current mode control based on the post-correction current detection value ILar. Consequently, the reactor current is controlled to be in agreement with the command current IL* calculated in step S13. As a result, the reactor current flows through the reactor 13 with distortion of the AC current Iac suppressed.

Upon completion of step S16, the process terminates.

Figure 8:
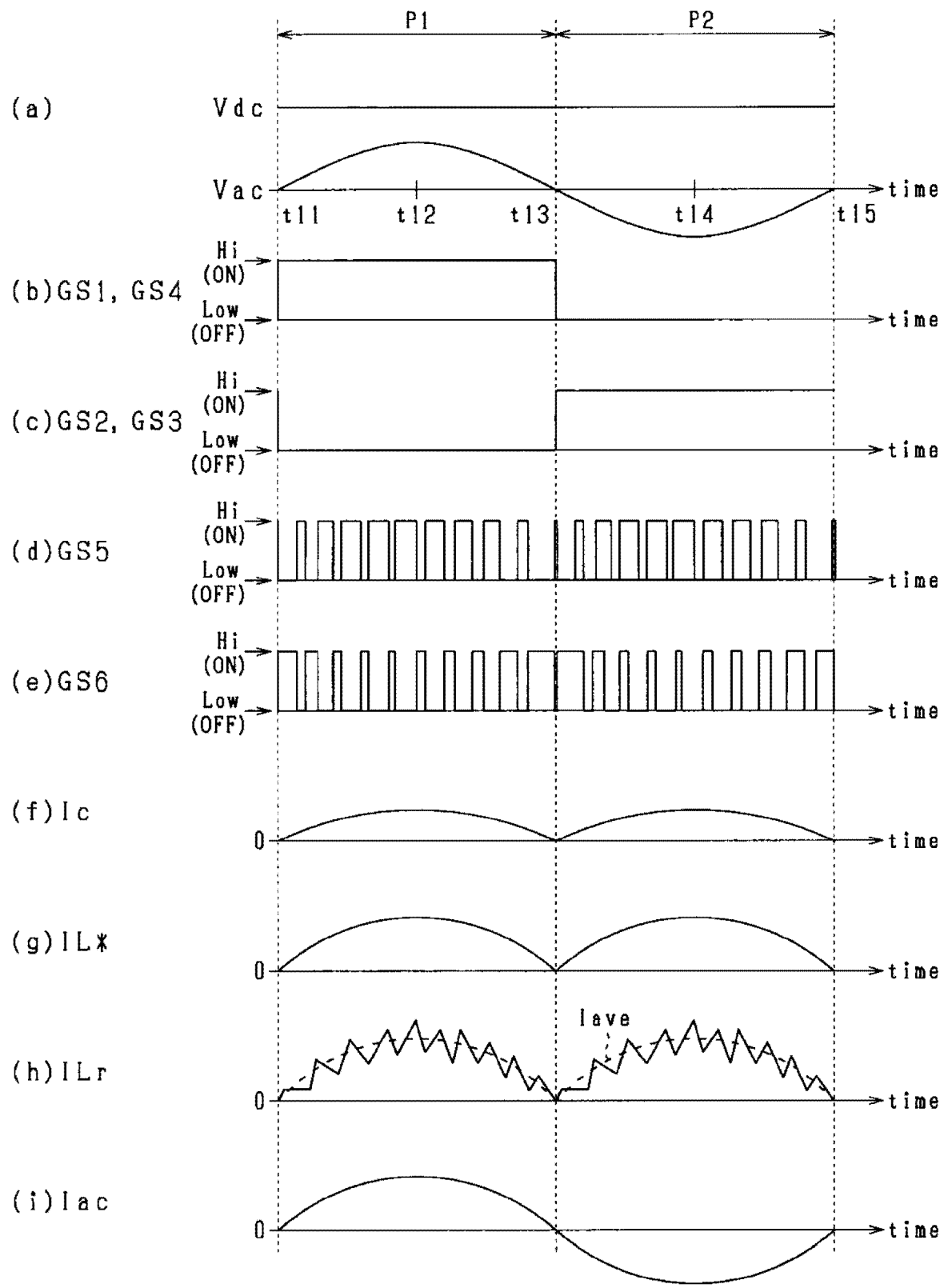
FIG. 8 is a time chart illustrating control of the electric power conversion apparatus by the control apparatus according to the first embodiment.

Next, operational effects of the present embodiment will be described with reference to FIGS. 8-10.

FIG. 8(a) shows the changes with time of the DC voltage Vdc and the AC voltage Vac. FIG. 8(b) shows the changes with time of the first and fourth gate signals GS1 and GS4. FIG. 8(c) shows the changes with time of the second and third gate signals GS2 and GS3. FIG. 8(d) shows the change with time of the fifth gate signal GS5. FIG. 8(e) shows the change with time of the sixth gate signal GS6. FIG. 8(f) shows the change with time of the current correction value Ic. FIG. 8(g) shows the change with time of the command current IL*. FIG. 8(h) shows the change with time of the current detection value ILr (or the reactor current IL). FIG. 8(i) shows the change with time of the AC current Iac. In addition, in FIG. 8(a), t11, t13 and t15 designate zero-crossing timings of the AC voltage Vac while t12 and t14 designate peak timings at which the AC voltage Vac has a positive or negative peak value.

For the first period P1 during which the AC voltage Vac is positive, both the first and fourth gate signals GS1 and GS4 are set to a high level, thereby placing both the first and fourth switches SW1 and SW4 in an ON state. On the other hand, both the second and third gate signals GS2 and GS3 are set to a low level, thereby placing both the second and third switches SW2 and SW3 in an OFF state. Consequently, during the first period P1, under the peak current mode control performed by the current control unit 50, the reactor current IL flows in accordance with the duty cycle of the fifth gate signal GS5. In addition, during the first period P1, the AC current Jac of the positive polarity flows in the electric power conversion apparatus 100.

For the second period P2 during which the AC voltage Vac is negative, both the first and fourth gate signals GS1 and GS4 are set to a low level, thereby placing both the first and fourth switches SW1 and SW4 in an OFF state. On the other hand, both the second and third gate signals GS2 and GS3 are set to a high level, thereby placing both the second and third switches SW2 and SW3 in an ON state. Consequently, during the second period P2, under the peak current mode control performed by the current control unit 50, the reactor current IL flows in accordance with the duty cycle of the fifth gate signal GS5. In addition, during the second period P2, the AC current Jac of the negative polarity flows in the electric power conversion apparatus 100.

During the first and second periods P1 and P2, the current correction value Ic changes so as to have a local minimum value at each of the zero-crossing timings t11, t13 and t15 and a local maximum value at each of the peak timings t12 and t14. That is, at the zero-crossing timings where the deviation $\Delta i$ is smallest, the current correction value Ic is set to be smaller than at any other timings; in contrast, at the peak timings where the deviation $\Delta i$ is largest, the current correction value Ic is set to be larger than at any other timings. Consequently, the duty cycle of the fifth switch SW5 changes according to the change tendency of the deviation $\Delta i$, thereby effectively suppressing distortion of the AC current Iac.

FIG. 9(a) shows the change with time of the command current IL* inputted to the comparator 352 according to the present embodiment. FIG. 9(b) shows the change with time of the command current IL* inputted to a comparator according to a comparative example.

In the comparative example, to the comparator, there is inputted a post-correction command current that is obtained by adding a correction value to the command current IL*. Therefore, as shown in FIG. 9(b), the full scale of the comparator is set in a range taking into account the increase due to the correction value.

In contrast, in the present embodiment, to the comparator 352, there is inputted the post-correction current detection value ILar that is obtained by subtracting the current correction value Ic from the current detection value ILr. Therefore, as shown in FIG. 9(a), the full scale of the comparator 352 is set to be smaller than that of the comparator in the comparative example.

Consequently, by suppressing increase in the full scale of the comparator 352 with respect to the input signals, the range of the command current IL* corresponding to the range of the output voltage (e.g., 0V-5V) is reduced and thus the resolution of the comparator 352 is increased in comparison with the comparative example.

FIG. 10(A) shows the change with time of the AC current Iac in the case of performing the peak current mode control according to the present embodiment using the current detection value ILr on which random noise is superimposed. FIG. 10(B) shows the change with time of the AC current Iac in the case of performing the peak current mode control according to the comparative example using the current detection value ILr on which random noise is superimposed. In FIGS. 10 (A) and 10 (B), the AC current Iac changes in the form of a sine wave in phase with the change of the AC voltage Vac.

In the comparative example, the THD (Total Harmonic Distortion) of the AC current Iac is equal to 2.3%. In contrast, in the present embodiment, the THD of the AC current Iac is equal to 1.4%. That is, in the present embodiment, with increase in the resolution of the comparator 352, the THD of the AC current Iac is lowered in comparison with the comparative example.

According to the present embodiment, it is possible to achieve the following advantageous effects.

In the present embodiment, the control apparatus 30 calculates the post-correction current detection value ILar by subtracting the current correction value Ic from the current detection value ILr. Then, to control the post-correction current detection value ILar to be in agreement with the command current IL*, the control apparatus 30 operates the fifth switch SW5 through the peak current mode control. Consequently, it becomes possible to suppress increase in the full scale of the comparator 352 with respect to the command current IL* while suppressing distortion of the AC current Iac.

Moreover, in the present embodiment, when the electric power conversion apparatus 100 converts the DC voltage into the AC voltage, the deviation $\Delta i$, which is the main cause of distortion of the AC current Iac, changes so as to be smallest at the zero-crossing timings of the AC voltage Vac and largest at the peak timings of the AC voltage Vac. Therefore, the control apparatus 30 sets the current correction value Ic to have: a local maximum value at each of a timing in the first period P1 during which the AC voltage Vac is positive and a timing in the second period P2 during which the AC voltage Vac is negative; and a local minimum value at a timing between the timings respectively in the first and second periods P1 and P2 at which it has the local maximum value. More particularly, the current correction value Ic to be subtracted from the current detection value ILr is set to have a minimum value at each of the zero-crossing timings of the AC voltage Vac and a maximum value at each of the peak timings of the AC voltage Vac. Consequently, the duty cycle of the fifth switch SW5 is set according to the change tendency of the deviation $\Delta i$, thereby effectively suppressing distortion of the AC current Iac.

First Modification of First Embodiment

The current sensor 32 may alternatively be provided between the source of the fifth switch SW5 and the drain of the sixth switch SW6 so as to be located closer than the first junction point K1 to the fifth switch SW5. In this case, current flowing through the fifth switch SW5 is acquired (or detected) as the current detection value ILr.

Second Modification of First Embodiment

The control apparatus 30 may keep the sixth gate signal GS6 at the low level, thereby keeping the sixth switch SW6 always in the OFF state.

Second Embodiment

A control apparatus 30 according to the second embodiment has a similar configuration to the control apparatus 30 according to the first embodiment. Therefore, only the differences therebetween will be mainly described hereinafter.

In the case of subtracting the current correction value Ic from the current detection value ILr while keeping the slope amount ms constant, the harmonic correction value Ih may not be set to a value with which it is possible to suitably reduce distortion of the AC current Iac. For example, the current detection value ILr is smaller at the zero-crossing timings of the AC voltage Vac than at any other timings. Therefore, setting the current correction value Ic to be smaller than the current detection value ILr, the set current correction value Ic will be smaller at the zero-crossing timings of the AC voltage Vac than at any other timings. In this case, it may become impossible to set the duty cycle of the fifth switch SW5 at the zero-crossing timings to a value with which it is possible to suitably reduce distortion of the AC current Iac.

In view of the above, in the present embodiment, the slope-amount setting unit 51 variably sets the slope amount ms representing the slope of the slope compensation signal Slope for compensating the post-correction current detection value ILar. Moreover, the correction value setting unit 40 sets the harmonic correction value Ih based on the variably-set slope amount ms and the AC voltage Vac.

Figure 11:
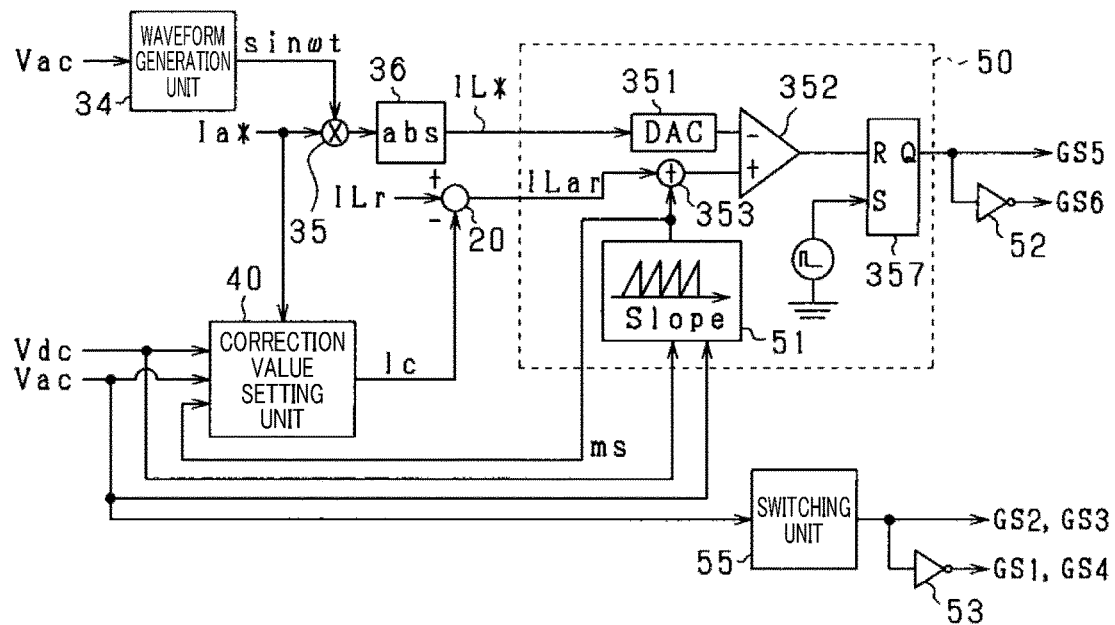
FIG. 11 is a functional block diagram of a control apparatus according to a second embodiment.

FIG. 11 shows the configuration of the control apparatus 30 according to the present embodiment.

In the present embodiment, the slope-amount setting unit 51 sets the slope amount ms based on the AC voltage Vac and the DC voltage Vdc.

To the correction value setting unit 40, there is further inputted the slope amount ms set by the slope-amount setting unit 51 in addition to the AC voltage Vac and the DC voltage Vdc. The correction value setting unit 40 sets the harmonic correction value Ih based on the AC voltage Vac, the DC voltage Vdc and the slope amount ms. Moreover, the correction value setting unit 40 outputs the result of multiplying the harmonic correction value Ih by the coefficient β as the current correction value Ic.

In the present embodiment, in the storage unit of the control apparatus 30, there is stored a correction value map representing the relationship between the AC voltage Vac, the slope amount ms and the harmonic correction value Ih. For example, the harmonic correction value Ih has been calculated, by the above equations (2) and (3), for various combinations of the AC voltage Vac, the DC voltage Vdc and the slope amount ms. Moreover, the correction value map has been made by associating the calculated harmonic correction value Ih with each combination of the AC voltage Vac, the DC voltage Vdc and the slope amount ms.

As described above, in the present embodiment, the control apparatus 30 sets the slope amount ms based on the AC voltage Vac and the DC voltage Vdc. Moreover, the control apparatus 30 sets the current correction value Ic based on the set slope amount ms. Consequently, it becomes possible to adjust the slope amount ms and the current correction value Ic according to the AC voltage Vac. As a result, it becomes possible to more reliably achieve both reduction in the full scale of the control apparatus 30 and reduction in distortion of the AC current Iac.

Third Embodiment

An electric power conversion apparatus 100 according to the third embodiment includes a DC-to-AC converter 10 that differs in circuit topology from the DC-to-AC converter 10 of the electric power conversion apparatus 100 according to the first embodiment. Specifically, unlike in the first embodiment, the DC-to-AC converter 10 includes no half-bridge circuit in the present embodiment.

Figure 12:
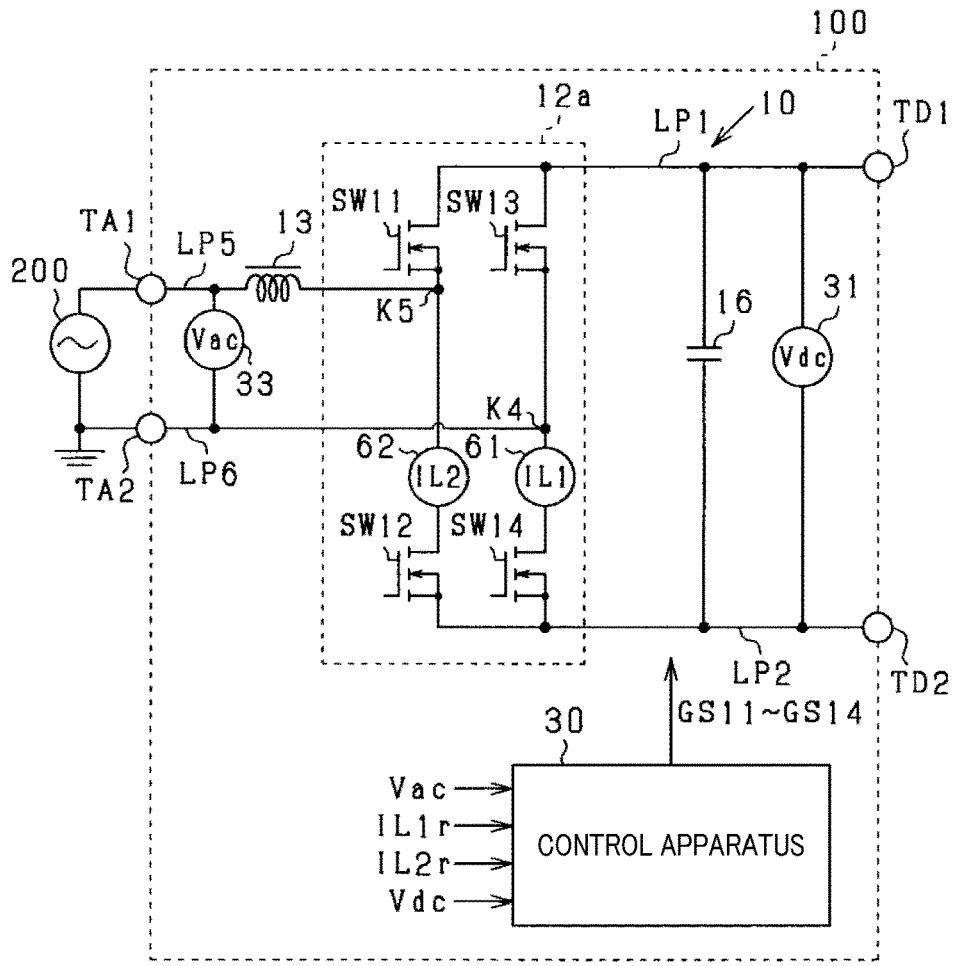
FIG. 12 is a configuration diagram of an electric power conversion apparatus according to a third embodiment.

FIG. 12 shows the overall configuration of the electric power conversion apparatus 100 according to the third embodiment.

As shown in FIG. 12, in the present embodiment, the first DC terminal TD1 is connected with a full-bridge circuit 12a via the first wiring LP1 while the second DC terminal TD2 is connected with the full-bridge circuit 12a via the second wiring LP2.

The full-bridge circuit 12a includes first to fourth switches SW11-SW14. The first to the fourth switches SW11-SW14 respectively correspond to the first to the fourth switches SW1-SW4 in the first embodiment; therefore, description of the first to the fourth switches SW11-SW14 is omitted hereinafter.

A fourth junction point K4 between the third and fourth switches SW13 and SW14 is connected with the first end of the sixth wiring LP6. Moreover, the second end of the sixth wiring LP6 is connected with the second AC terminal TA2. On the other hand, a fifth junction point K5 between the first and second switches S11 and S12 is connected with the first end of the fifth wiring LP5. Moreover, the second end of the fifth wiring LP5 is connected with the first AC terminal TAL. Furthermore, the reactor 13 is provided in a part of the fifth wiring LP5.

In the present embodiment, the full-bridge circuit 12a further includes a first current sensor 61 for detecting the reactor current IL during a first period P1 as a first current detection value IL1r and a second current sensor 62 for detecting the reactor current IL during a second period P2 as a second current detection value IL2r.

The first current sensor 61 is provided in a wiring connecting the source of the third switch SW13 and the drain of the fourth switch SW14 so as to be located closer than the fourth junction point K4 to the drain of the fourth switch S14. The first current sensor 61 detects current flowing through the fourth switch S14 as the first current detection value IL1r.

The second current sensor 62 is provided in a wiring connecting the source of the first switch SW11 and the drain of the second switch SW12 so as to be located closer than the fifth junction point K5 to the drain of the second switch SW12. The second current sensor 62 detects current flowing through the second switch SW12 as the second current detection value IL2r.

Figure 13:
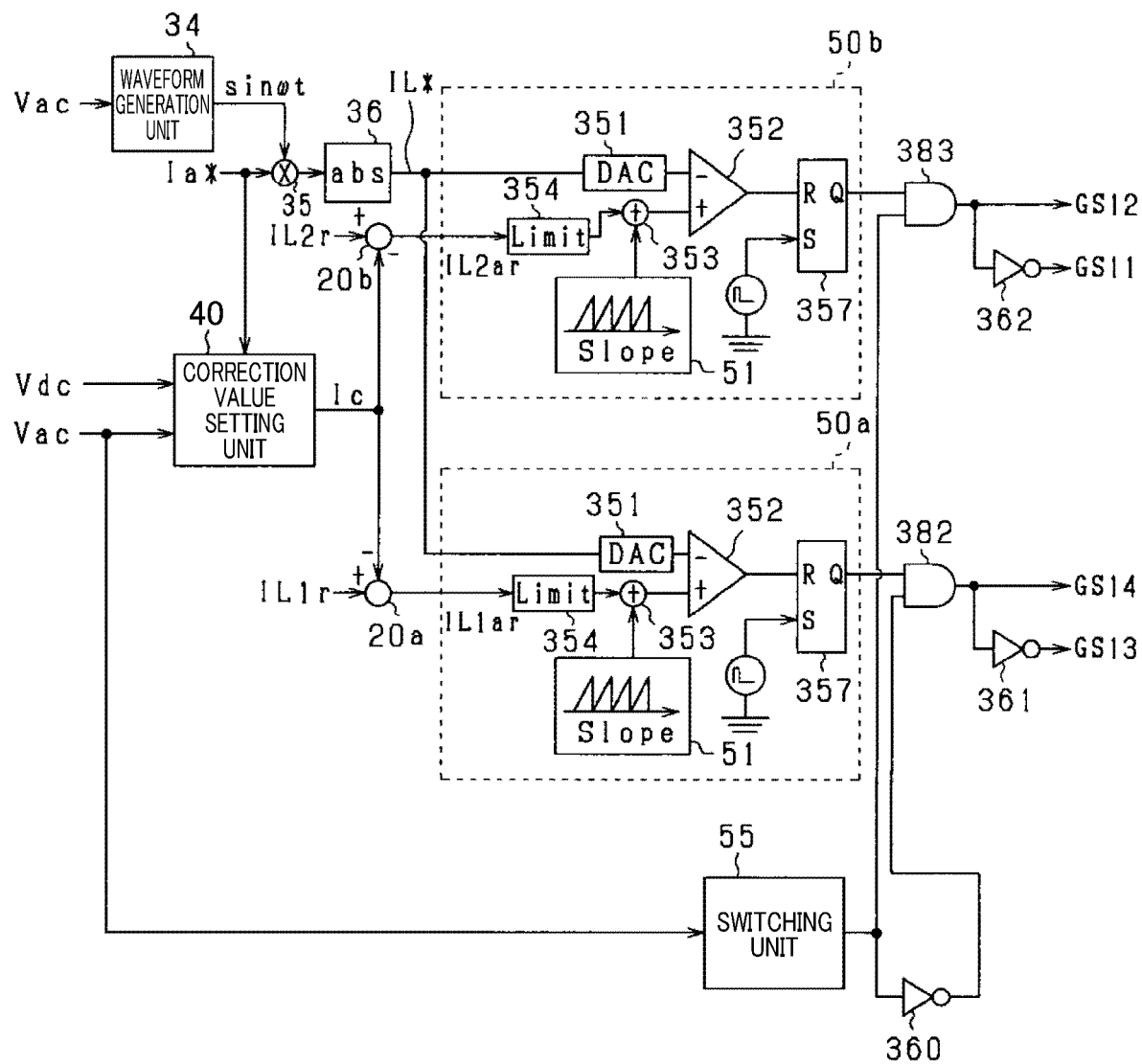
FIG. 13 is a functional block diagram of a control apparatus applied to the electric power conversion apparatus according to the third embodiment.

FIG. 13 shows the configuration of a control apparatus 30 according to the third embodiment. The control apparatus 30 is configured to control the DC-to-AC converter 10 by peak current mode control.

As shown in FIG. 13, in the present embodiment, the control apparatus 30 includes a first correction unit 20a, a second correction unit 20b, a first current control unit 50a and a second current control unit 50b.

The first correction unit 20a calculates a first post-correction current detection value IL1ar by subtracting a current correction value Ic from the first current detection value IL1r.

The second correction unit 20b calculates a second post-correction current detection value IL2ar by subtracting the current correction value Ic from the second current detection value IL2r.

The first current control unit 50a operates the third and fourth switches SW13 and SW14 through the peak current mode control, so as to control the first post-correction current detection value IL1ar to be in agreement with the command current IL* during the first period P1.

The second current control unit 50b operates the first and second switches SW11 and SW12 through the peak current mode control, so as to control the second post-correction current detection value IL2ar to be in agreement with the command current IL* during the second period P2.

In the present embodiment, the first current control unit 50a includes a limiter 354 for limiting the lower limit of the first post-correction current detection value IL1ar outputted from the first correction unit 20a. Similarly, the second current control unit 50b includes a limiter 354 for limiting the lower limit of the second post-correction current detection value IL2ar outputted from the second correction unit 20b.

The configurations of the first and second current control units 50a and 50b in the present embodiment are identical to the configuration of the current control unit 50 in the first embodiment except for the limiters 354. Therefore, further explanation of the first and second current control units 50a and 50b is omitted hereinafter.

The first current control unit 50a has an output terminal connected with a first input terminal of a first AND circuit 382. Similarly, the second current control unit 50b has an output terminal connected with a first input terminal of a second AND circuit 383.

The output terminal of the switching unit 55 is connected with both a second input terminal of the second AND circuit 383 and an input terminal of a phase inverter 360. Moreover, an output terminal of the phase inverter 360 is connected with a second input terminal of the first AND circuit 382.

In the present embodiment, the switching unit 55 sets its output signal to a low level when the AC voltage Vac is determined to be positive, and to a high level when the AC voltage Vac is determined to be negative.

To the first and second input terminals of the first AND circuit 382, there are respectively inputted output signals from the first current control unit 50a and the switching unit 55. The first AND circuit 382 has an output terminal connected with the gate of the fourth switch SW14 and outputs a fourth gate signal GS14 to the gate of the fourth switch SW14 via the output terminal. Moreover, the output terminal of the first AND circuit 382 is also connected with the gate of the third switch S13 via a phase inverter 361. The signal outputted from the output terminal of the first AND circuit 382 to the gate of the third switch S13 via the phase inverter 361 constitutes a third gate signal GS13 for operating the third switch S13. The third gate signal GS13 is in inverse relation to the fourth gate signal GS14.

To the first and second input terminals of the second AND circuit 383, there are respectively inputted an output signal from the second current control unit 50b and the output signal from the switching unit 55. The second AND circuit 383 has an output terminal connected with the gate of the second switch SW12 and outputs a second gate signal GS12 to the gate of the second switch SW12 via the output terminal. Moreover, the output terminal of the second AND circuit 383 is also connected with the gate of the first switch SW11 via a phase inverter 362. The signal outputted from the output terminal of the second AND circuit 383 to the gate of the first switch SW11 via the phase inverter 362 constitutes a first gate signal GS11 for operating the first switch SW11. The first gate signal GS11 is in inverse relation to the second gate signal GS12.

In response to input of high-level output signals from the switching unit 55 and the first current control unit 50a to the first AND circuit 382, the fourth gate signal GS14 is set to a high level whereas the third gate signal GS13 is set to a low level. On the other hand, in response to input of high-level output signals from the switching unit 55 and the second current control unit 50b to the second AND circuit 383, the second gate signal GS12 is set to a high level whereas the first gate signal GS 11 is set to a low level.

Figure 14:
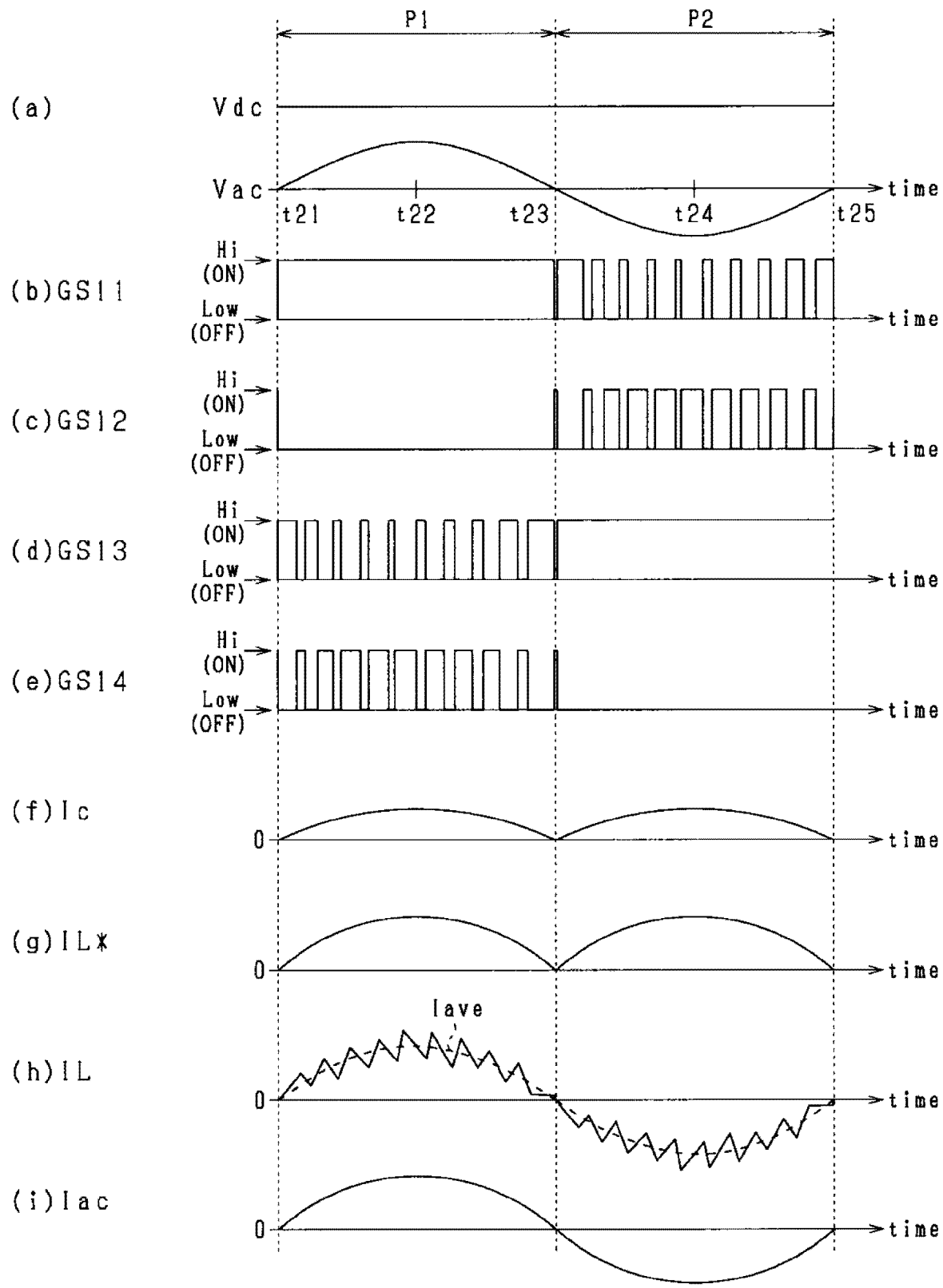
FIG. 14 is a time chart illustrating control of the electric power conversion apparatus by the control apparatus according to the third embodiment.

FIG. 14 illustrates control of the DC-to-AC converter 10 by the control apparatus 30 according to the third embodiment.

Specifically, FIG. 14(a) shows the changes with time of the DC voltage Vdc and the AC voltage Vac. FIG. 14(b) shows the change with time of the first gate signal GS11. FIG. 14(c) shows the change with time of the second gate signal GS12. FIG. 14(d) shows the change with time of the third gate signal GS13. FIG. 14(e) shows the change with time of the fourth gate signal GS14. FIG. 14(f) shows the change with time of the current correction value Ic. FIG. 14(g) shows the change with time of the command current IL*. FIG. 14(h) shows the change with time of the reactor current IL. FIG. 14(i) shows the change with time of the AC current Iac.

For the first period P1 during which the AC voltage Vac is positive, in the full-bridge circuit 12a, the first switch SW11 is placed in an ON state by setting the first gate signal GS11 to a high level while the second switch SW12 is placed in an OFF state by setting the second gate signal GS12 to a low level. Moreover, during the first period P1, the reactor current IL is detected by the first current sensor 61 as the first current detection value IL1r; the first post-correction current detection value IL1ar is calculated by the first correction unit 20a by subtracting the current correction value Ic from the first current detection value IL1r. Furthermore, to control the first post-correction current detection value IL1ar to be in agreement with the command current IL*, the first current control unit 50a changes the fourth gate signal GS14 between a high level and a low level. In addition, the third gate signal GS13 is controlled to be in inverse relation to the fourth gate signal GS14.

During the first period P1, the current correction value Ic changes so as to have a local minimum value at each of zero-crossing timings t21 and t23 and a local maximum value at a peak timing t22. Therefore, the amount of subtraction from the first current detection value IL1r by the current correction value Ic is smallest at the peak timing t22 and largest at the zero-crossing timings t21 and t23. Consequently, the duty cycle of the fourth switch SW14 is set by the first current control unit 50a according to the change tendency of the deviation Δi.

For the second period P2 during which the AC voltage Vac is negative, in the full-bridge circuit 12a, the third switch SW13 is placed in an ON state by setting the third gate signal GS13 to a high level while the fourth switch SW14 is placed in an OFF state by setting the fourth gate signal GS14 to a low level. Moreover, during the second period P2, the reactor current IL is detected by the second current sensor 62 as the second current detection value IL2r; the second post-correction current detection value IL2ar is calculated by the second correction unit 20b by subtracting the current correction value Ic from the second current detection value IL2r. Furthermore, to control the second post-correction current detection value IL2ar to be in agreement with the command current IL*, the second current control unit 50b changes the second gate signal GS12 between a high level and a low level. In addition, the first gate signal GS11 is controlled to be in inverse relation to the second gate signal GS12.

During the second period P2, the current correction value Ic changes so as to have a local minimum value at each of zero-crossing timings t23 and t25 and a local maximum value at a peak timing t24. That is, the current correction value Ic, which is subtracted from the second current detection value IL2r, has a maximum value at the peak timing t24 and a minimum value at each of the zero-crossing timings t23 and t25. Consequently, the duty cycle of the second switch SW12 is set by the second current control unit 50b according to the change tendency of the deviation Δi.

According to the third embodiment, it is also possible to achieve the same advantageous effects as achievable according to the first embodiment.

First Modification of Third Embodiment

Figure 15:
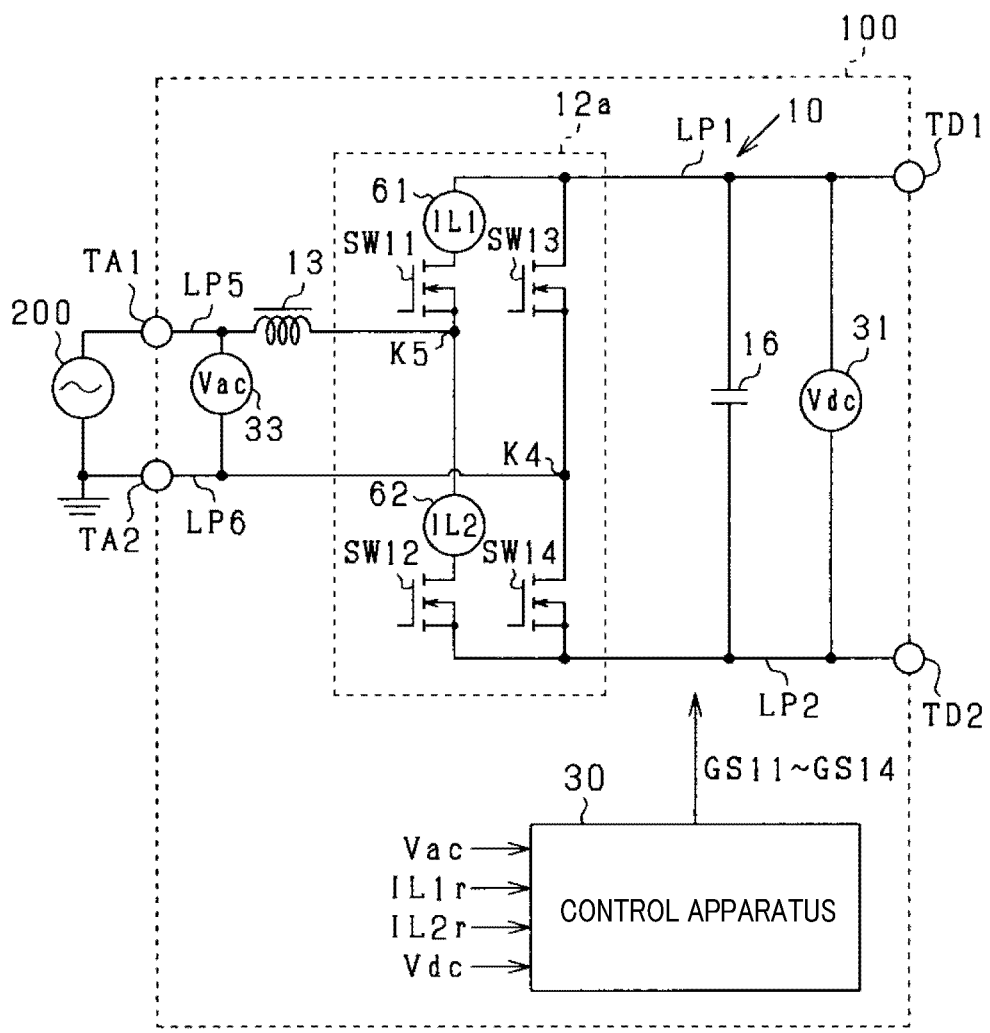
FIG. 15 is a configuration diagram of an electric power conversion apparatus according to a first modification of the third embodiment.

FIG. 15 shows the configuration of an electric power conversion apparatus 100 according to the first modification of the third embodiment.

As shown in FIG. 15, in this modification, the first current sensor 61 is provided on the drain side of the first switch SW11 to detect current flowing through the first switch SW11 as the first current detection value IL1r. Moreover, the second current sensor 62 is provided in the wiring connecting the source of the first switch SW11 and the drain of the second switch SW12 so as to be located closer than the fifth junction point K5 to the second switch SW12. The second current sensor 62 detects current flowing through the second switch SW12 as the second current detection value IL2r.

In this modification, during the first period P1 for which the AC voltage Vac is positive, the first post-correction current detection value IL1ar is calculated by subtracting the current correction value Ic from the first current detection value IL1r detected by the first current sensor 61. Moreover, during the first period P1, the duty cycle of the first switch SW11 is set by the peak current mode control using the first post-correction current detection value IL1ar. On the other hand, during the second period P2 for which the AC voltage Vac is negative, the second post-correction current detection value IL2ar is calculated by subtracting the current correction value Ic from the second current detection value IL2r detected by the second current sensor 62. Moreover, during the second period P2, the duty cycle of the second switch SW12 is set by the peak current mode control using the second post-correction current detection value IL2ar.

According to this modification, it is also possible to achieve the same advantageous effects as achievable according to the third embodiment.

Second Modification of Third Embodiment

The second current sensor 62 may alternatively be provided on the drain side of the third switch SW13 while the first current sensor 61 is provided on the drain side of the first switch SW11. In this case, the first current sensor 61 detects current flowing through the first switch SW11 as the first current detection value IL1r; the second current sensor 62 detects current flowing through the third switch SW13 as the second current detection value IL2r.

According to this modification, it is also possible to achieve the same advantageous effects as achievable according to the third embodiment.

Third Modification of Third Embodiment

In the third embodiment, the third switch SW13 may alternatively be always kept in an OFF state during the first period P1 and the first switch SW11 may alternatively be always kept in an OFF state during the second period P2. In this case, in the time chart shown in FIG. 14, the control apparatus 30 may keep the third gate signal GS13 at the low level during the first period P1 and the first gate signal GS11 at the low level during the second period P2.

Fourth Embodiment

An electric power conversion apparatus 100 according to the fourth embodiment has a similar configuration to the electric power conversion apparatus 100 according to the third embodiment. Therefore, only the differences therebetween will be mainly described hereinafter.

Figure 16:
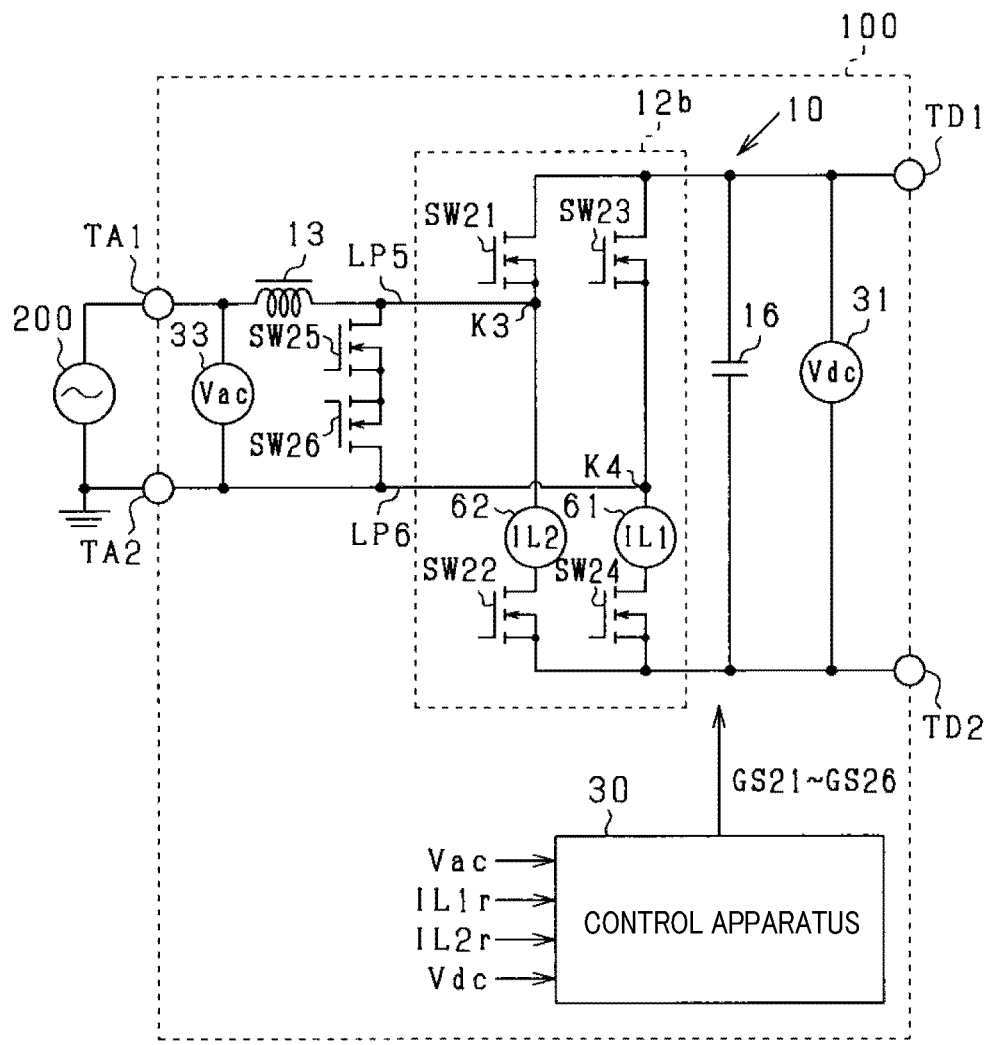
FIG. 16 is a configuration diagram of an electric power conversion apparatus according to a fourth embodiment.

FIG. 16 shows the overall configuration of the electric power conversion apparatus 100 according to the fourth embodiment.

As shown in FIG. 16, in the present embodiment, the electric power conversion apparatus 100 includes a DC-to-AC converter 10 that has a fifth switch SW25 and a sixth switch SW26 connected between the first and second AC terminals TA1 and TA2 and a full-bridge circuit 12b.

Specifically, the source of the fifth switch SW25 is connected with the source of the sixth switch SW26. Moreover, the drain of the fifth switch SW25 is connected with a junction point in the fifth wiring LP5 which is located between the reactor 13 and the full-bridge circuit 12b, while the drain of the sixth switch SW26 is connected with the sixth wiring LP6. In addition, each of the fifth and sixth switches SW25 and SW26 has a parasitic diode connected in antiparallel thereto.

In the present embodiment, the full-bridge circuit 12b includes first to fourth switches SW21-S24. The first to the fourth switches SW21-SW24 respectively correspond to the first to the fourth switches SW11-SW14 in the third embodiment; therefore, description of the first to the fourth switches SW21-SW24 is omitted hereinafter.

Figure 17:
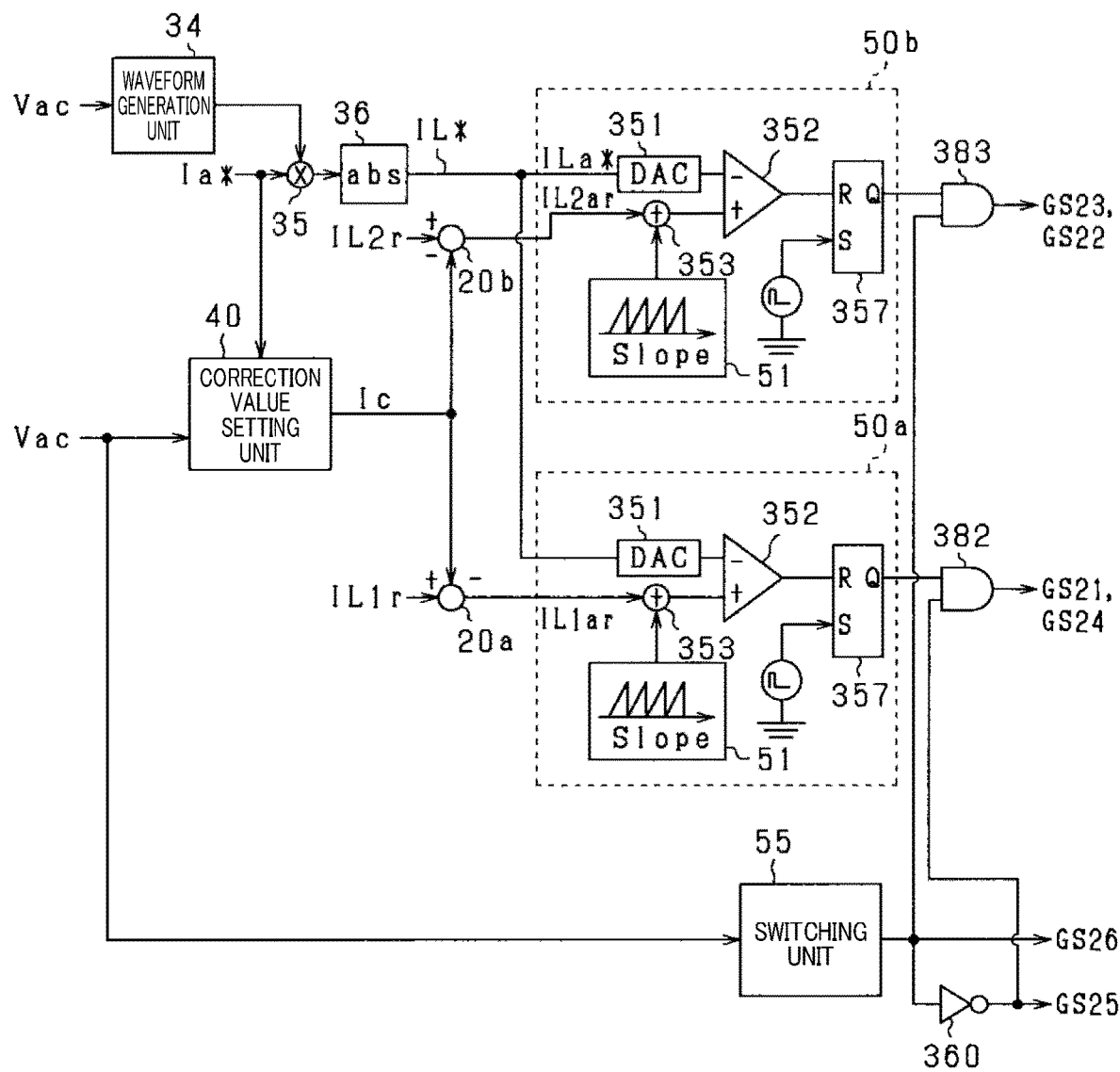
FIG. 17 is a functional block diagram of a control apparatus applied to the electric power conversion apparatus according to the fourth embodiment.

FIG. 17 shows the configuration of a control apparatus 30 according to the fourth embodiment. The control apparatus 30 is configured to control the DC-to-AC converter 10 by peak current mode control.

As shown in FIG. 17, in the present embodiment, the first post-correction current detection value IL1ar, which is calculated by the first correction unit 20a by subtracting the current correction value Ic from the first current detection value IL1r, is inputted to the first current control unit 50a. On the other hand, the second post-correction current detection value IL2ar, which is calculated by the second correction unit 20b by subtracting the current correction value Ic from the second current detection value IL2r, is inputted to the second current control unit 50b.

The output terminal of the switching unit 55 is connected with the second input terminal of the second AND circuit 383, the gate of the sixth switch SW26 and the input terminal of the phase inverter 360. Moreover, the output terminal of the phase inverter 360 is connected with the second input terminal of the first AND circuit 382 and the gate of the fifth switch SW25.

The output terminal of the first AND circuit 382 is connected with the gates of the first and fourth switches SW21 and SW24. On the other hand, the output terminal of the second AND circuit 383 is connected with the gates of the second and third switches SW22 and SW23.

Figure 18:
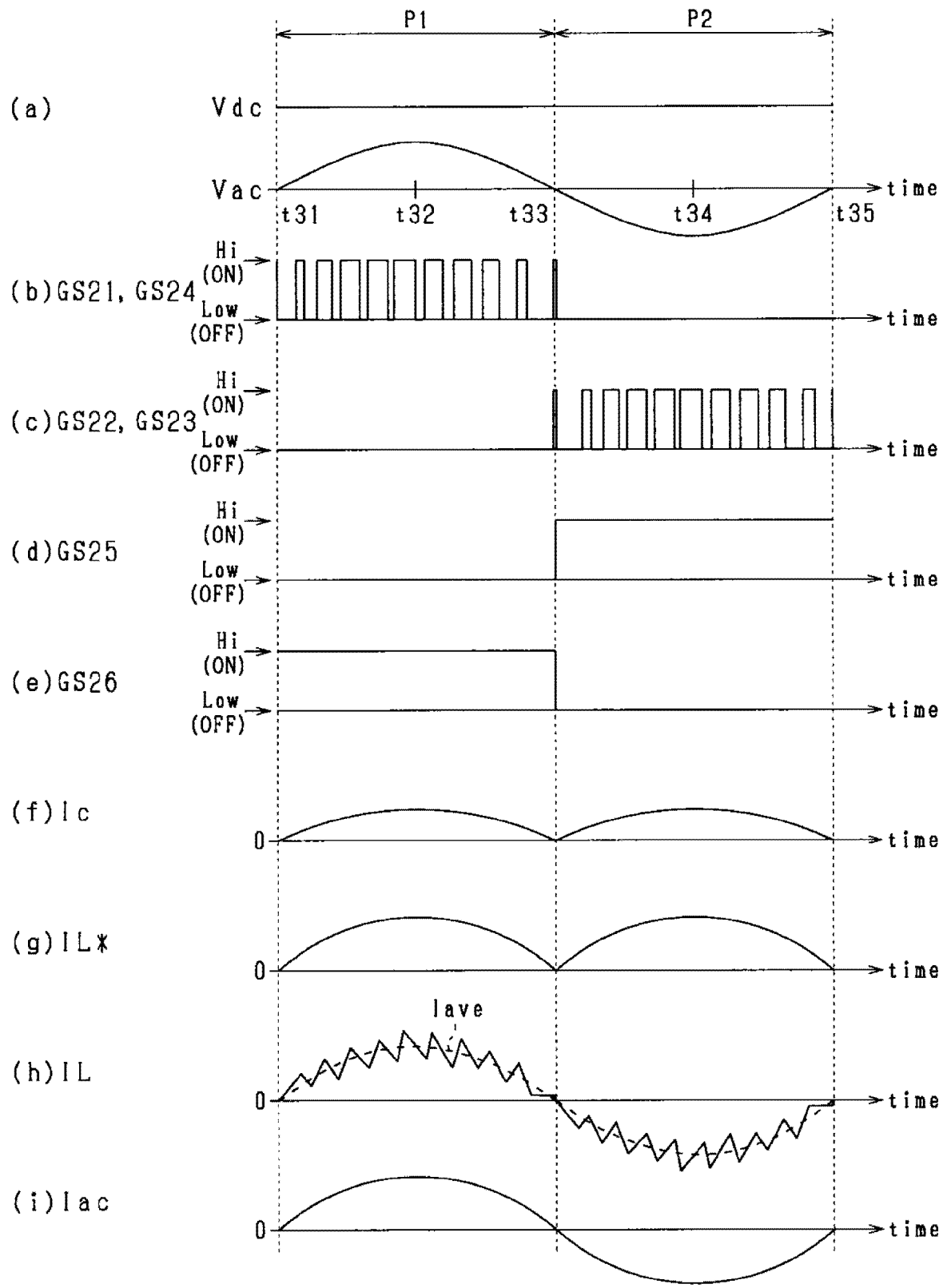
FIG. 18 is a time chart illustrating control of the electric power conversion apparatus by the control apparatus according to the fourth embodiment.

FIG. 18 illustrates control of the DC-to-AC converter 10 by the control apparatus 30 according to the fourth embodiment.

Specifically, FIG. 18(a) shows the changes with time of the DC voltage Vdc and the AC voltage Vac. FIG. 18(b) shows the changes with time of the first and fourth gate signals GS21 and GS24. FIG. 18(c) shows the changes with time of the second and third gate signals GS22 and GS23. FIG. 18(d) shows the change with time of the fifth gate signal GS25. FIG. 18(e) shows the change with time of the sixth gate signal GS26. FIG. 18(f) shows the change with time of the current correction value Ic. FIG. 18(g) shows the change with time of the command current IL*. FIG. 18(h) shows the change with time of the current detection value ILr (or the reactor current IL). FIG. 18(i) shows the change with time of the AC current Iac.

For the first period P1 during which the AC voltage Vac is positive, the sixth switch SW26 is placed in an ON state by setting the sixth gate signal GS26 to a high level while the fifth switch SW25 is placed in an OFF state by setting the fifth gate signal GS25 to a low level. Moreover, during the first period P1, to control the first post-correction current detection value IL1ar to be in agreement with the command current IL*, the first current control unit 50a changes both the first and fourth gate signals GS21 and GS24 between a high level and a low level.

In the present embodiment, during the first period P1, the current correction value Ic changes so as to have a local minimum value at each of zero-crossing timings t31 and t33 and a local maximum value at a peak timing t32. Consequently, the duty cycle of the first and fourth switches SW21 and SW24 is set by the first current control unit 50a according to the change tendency of the deviation Δi.

For the second period P2 during which the AC voltage Vac is negative, the sixth switch SW26 is placed in an OFF state by setting the sixth gate signal GS26 to a low level while the fifth switch SW25 is placed in an ON state by setting the fifth gate signal GS25 to a high level. Moreover, during the second period P2, to control the second post-correction current detection value IL2ar to be in agreement with the command current IL*, the second current control unit 50b changes both the second and third gate signals GS22 and GS23 between a high level and a low level.

In the present embodiment, during the second period P2, the current correction value Ic changes so as to have a local minimum value at each of zero-crossing timings t33 and t35 and a local maximum value at a peak timing t34. Consequently, the duty cycle of the second and third switches SW22 and SW23 is set by the second current control unit 50b according to the change tendency of the deviation Δi.

According to the fourth embodiment, it is also possible to achieve the same advantageous effects as achievable according to the first embodiment.

Fifth Embodiment

An electric power conversion apparatus 100 according to the fifth embodiment has a similar configuration to the electric power conversion apparatus 100 according to the first embodiment. Therefore, only the differences therebetween will be mainly described hereinafter.

Figure 19:
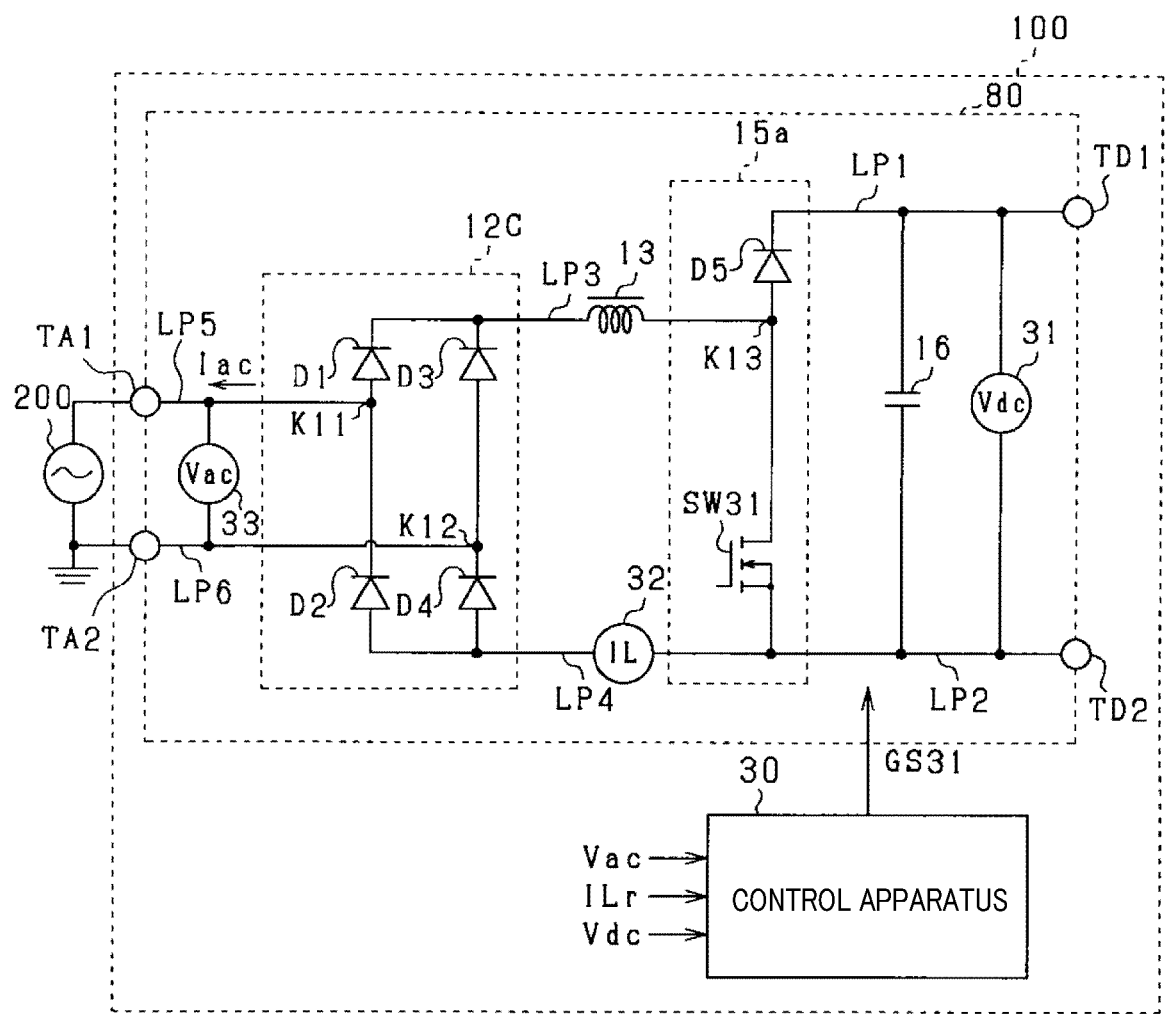
FIG. 19 is a configuration diagram of an electric power conversion apparatus according to a fifth embodiment.

FIG. 19 shows the overall configuration of the electric power conversion apparatus 100 according to the fifth embodiment.

As shown in FIG. 19, in the present embodiment, the electric power conversion apparatus 100 includes an AC-to-DC converter 80 that is configured to convert an AC voltage into a DC voltage. The AC-to-DC converter 80 includes a full-bridge circuit 12c and a half-bridge circuit 15a.

The full-bridge circuit 12c is configured with first to fourth diodes D1-D4. The anode of the first diode D1 is connected with the cathode of the second diode D2. Similarly, the anode of the third diode D3 is connected with the cathode of the fourth diode D4. Moreover, each of the cathodes of the first and third diodes D1 and D3 is connected with a first end of a third wiring LP3, while each of the anodes of the second and fourth diodes D2 and D4 is connected with a first end of a fourth wiring LP4.

In the full-bridge circuit 12c, a first junction point K11 between the first diode D1 and the second diode D2 is connected with a first end of a fifth wiring LP5. Moreover, a second end of the fifth wiring LP5 is connected with a first AC terminal TAL. On the other hand, a second junction point K12 between the third diode D3 and the fourth diode D4 is connected with a first end of a sixth wiring LP6. Moreover, a second end of the sixth wiring LP6 is connected with a second AC terminal TA2.

The half-bridge circuit 15a includes a fifth diode D5 and a switch SW31. The switch SW 31 is implemented by a voltage-driven switch, more particularly by an N-channel MOSFET in the present embodiment.

The anode of the fifth diode D5 is connected with the drain of the switch SW31. The cathode of the fifth diode D5 is connected with a first end of a first wiring LP1. Moreover, a second end of the first wiring LP1 is connected with a first DC terminal TD1. On the other hand, the source of the switch SW31 is connected with a first end of a second wiring LP2. Moreover, a second end of the second wiring LP2 is connected with a second DC terminal TD2. In addition, the switch SW31 has a parasitic diode connected in antiparallel thereto.

A third junction point K13 between the fifth diode D5 and the switch SW31 is connected with a second end of the third wiring LP3. Moreover, a reactor 13 is provided in the third wiring LP3. On the other hand, the source of the switch SW31 is also connected with a second end of the fourth wiring LP4. That is, the first end of the second wiring LP2 is connected with the second end of the fourth wiring LP4.

Figure 20:
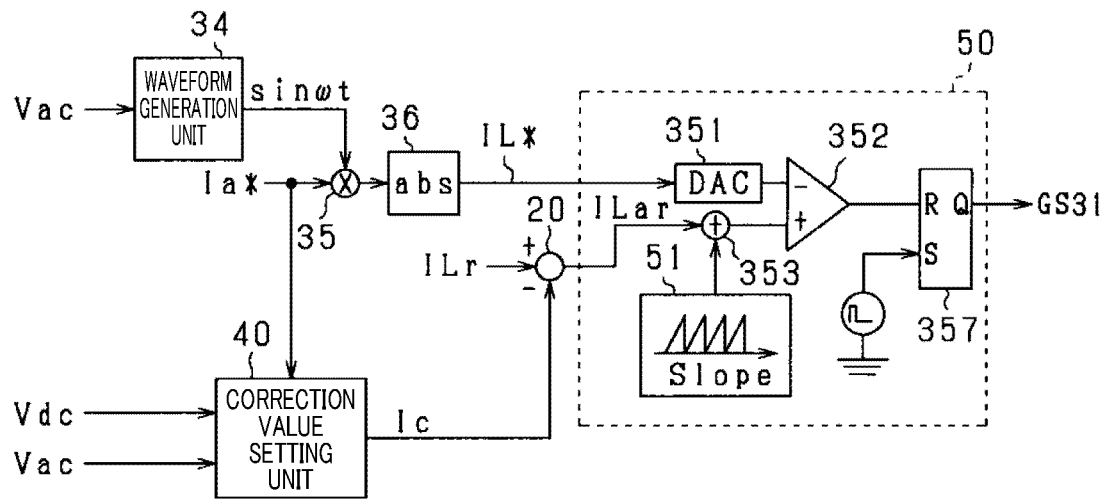
FIG. 20 is a functional block diagram of a control apparatus applied to the electric power conversion apparatus according to the fifth embodiment.

FIG. 20 shows the configuration of a control apparatus 30 according to the fifth embodiment. The control apparatus 30 is configured to control the AC-to-DC converter 80 by peak current mode control.

As shown in FIG. 20, in the present embodiment, the control apparatus 30 includes a correction unit 20 that calculates the post-correction current detection value ILar by subtracting the current correction value Ic from the current detection value ILr.

The control apparatus 30 also includes a current control unit 50 that outputs, through the peak current mode control using the post-correction current detection value ILar and the command current IL*, a gate signal GS31 for operating the switch SW31. The current control unit 50 has an output terminal connected with the gate of the switch SW31 and outputs the gate signal GS31 to the gate of the switch SW31 via the output terminal.

Next, operation of the electric power conversion apparatus 100 according to the fifth embodiment will be described.

For a first period P1 during which the AC voltage Vac is positive, the first and fourth diodes D1 and D4 conduct current. In contrast, for a second period P2 during which the AC voltage Vac is negative, the second and third diodes D2 and D3 conduct current.

During the first and second periods P1 and P2, by the peak current mode control performed by the current control unit 50, the gate signal GS31 is changed between a high level and a low level, thereby controlling the duty cycle of the switch SW31. When the switch SW31 is in an ON state, current flows through the reactor 13, storing magnetic energy in the reactor 13. In contrast, when the switch SW31 is in an OFF state, by virtue of the magnetic energy stored in the reactor 13, current flows through the fifth diode D5 to the first DC terminal TD1.

Figure 21:
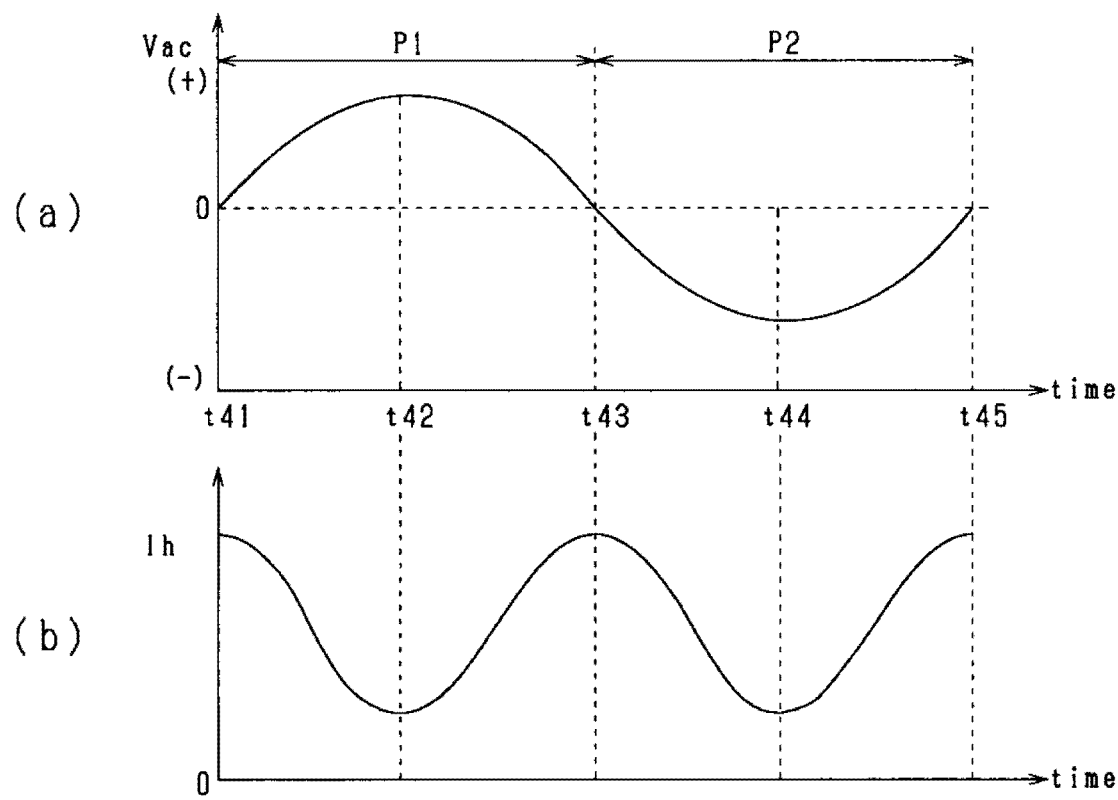
FIG. 21 is a time chart illustrating the changes with time of an AC voltage and a harmonic correction value set by a correction value setting unit of the control apparatus according to the fifth embodiment.

FIG. 21(a) shows the change with time of the AC voltage Vac and FIG. 21(b) shows the change with time of the harmonic correction value Ih. When the electric power conversion apparatus 100 converts the AC voltage Vac into the DC voltage Vdc, the deviation Δi, which represents the difference between the average value Iave of the reactor current IL with distortion occurring therein and the command current IL*, becomes largest in the vicinities of the zero-crossing timings (t41, t43, t45) at which the AC voltage Vac is equal to 0. Moreover, the deviation Δi becomes smallest in the vicinities of the peak timings (t42, t44) of the AC voltage Vac.

In the present embodiment, the correction value setting unit 40 sets the harmonic correction value Ih to have: a local minimum value at each of a timing in the first period P1 during which the AC voltage Vac is positive and a timing in the second period P2 during which the AC voltage Vac is negative; and a local maximum value at a timing between the timings respectively in the first and second periods P1 and P2 at which it has the local minimum value. More specifically, the correction value setting unit 40 sets the harmonic correction value Ih so that the harmonic correction value Ih has a maximum value at each of the zero-crossing timings of the AC voltage Vac and a minimum value at each of the peak timings of the AC voltage Vac. Moreover, the correction value setting unit 40 calculates the current correction value Ic by multiplying the harmonic correction value Ih by the coefficient β. Consequently, the current correction value Ic to be subtracted from the current detection value ILr becomes largest at the zero-crossing timings and smallest at the peak timings.

In the present embodiment, the control apparatus 30 includes a storage unit (not shown). In the storage unit, there is stored a correction value map representing information on the harmonic correction value Ih associated with the AC voltage Vac and the DC voltage Vdc. Therefore, it is possible for the correction value setting unit 40 to set, by referring to the correction value map, the harmonic correction value Ih according to the AC voltage Vac and the DC voltage Vdc.

Next, explanation will be given of a method of making the correction value map according to the present embodiment.

When the AC-to-DC converter 80 converts the AC voltage into the DC voltage, the duty cycle D can be calculated by the following equation (4).

$$D = 1 - \frac{|Vac|}{Vdc} \quad (4)$$

The slope mb of increase of the reactor current IL (i.e., the rate of increase of the reactor current IL) satisfies the relationship of (mb=|Vac|/L). The deviation Δi can be calculated by the following equation (5) that is obtained by substituting the above relationship into the equation (1).

$$\Delta i = \frac{|Vac|}{2L} \cdot D \cdot Tsw + ms \cdot D \cdot Tsw \quad (5)$$

In the present embodiment, the harmonic correction value Ih is calculated, by the above equations (4) and (5), for various combinations of the AC voltage Vac and the DC voltage Vdc. Moreover, the correction value map is made by associating the calculated harmonic correction value Ih with each combination of the AC voltage Vac and the DC voltage Vdc.

Figure 22:
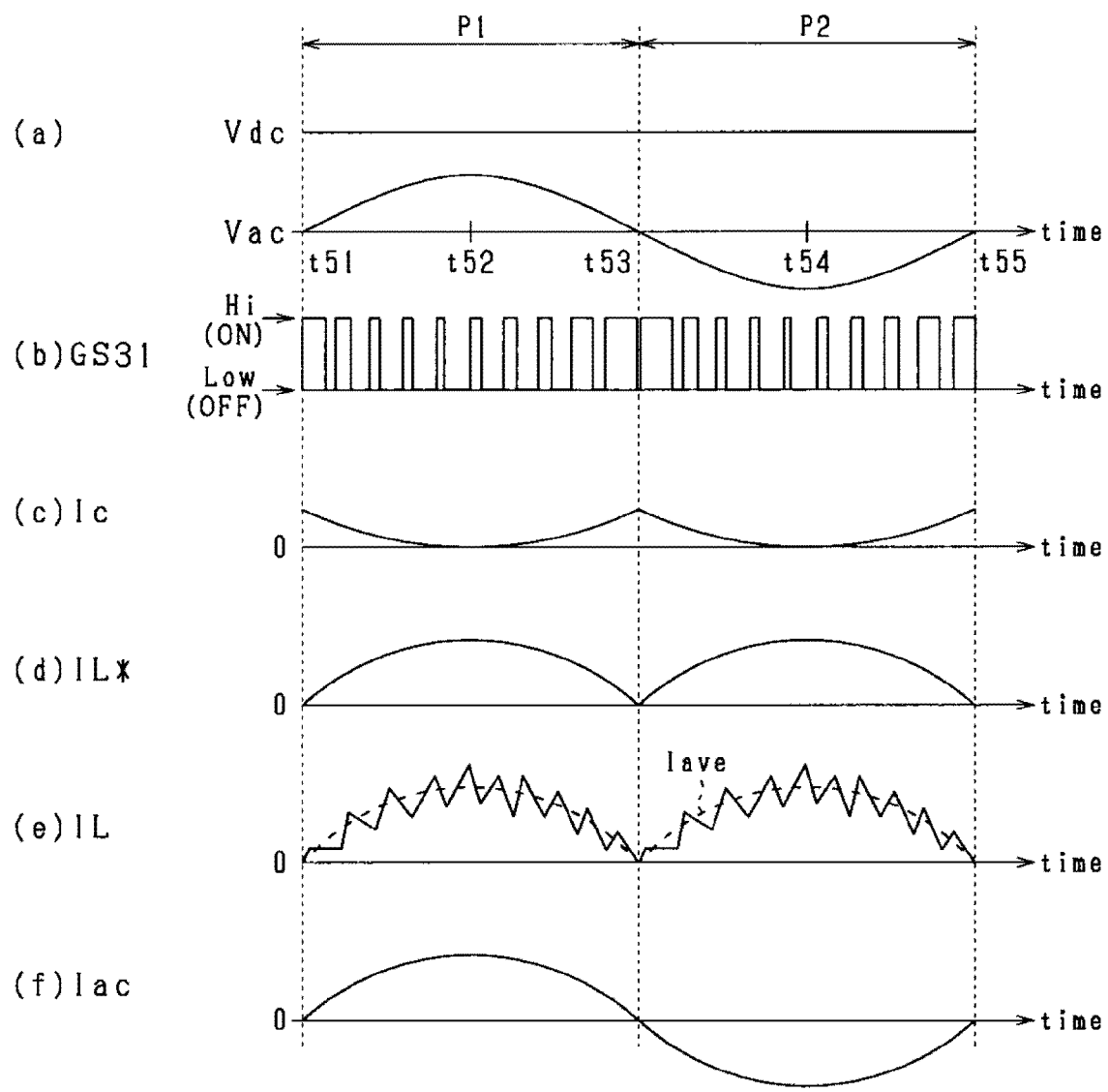
FIG. 22 is a time chart illustrating control of the electric power conversion apparatus by the control apparatus according to the fifth embodiment.

Next, operational effects of the present embodiment will be described with reference to FIG. 22.

FIG. 22(a) shows the changes with time of the DC voltage Vdc and the AC voltage Vac. FIG. 22(b) shows the change with time of the gate signal GS31. FIG. 22(c) shows the change with time of the current correction value Ic. FIG. 22(d) shows the change with time of the command current IL*. FIG. 22(e) shows the change with time of the reactor current IL. FIG. 22(f) shows the change with time of the AC current Iac. In addition, in FIG. 22(a), t51, t53 and t55 designate zero-crossing timings of the AC voltage Vac while t52 and t54 designate peak timings at which the AC voltage Vac has a positive or negative peak value.

During the first and second periods P1 and P2, the current correction value Ic changes so as to have a local maximum value at each of the zero-crossing timings t51, t53 and t55 and a local minimum value at each of the peak timings t52 and t54. That is, at the zero-crossing timings where the deviation Δi is largest, the current correction value Ic to be subtracted from the current detection value ILr is set to be larger than at any other timings; in contrast, at the peak timings where the deviation Δi is smallest, the current correction value Ic to be subtracted from the current detection value ILr is set to be smaller than at any other timings. Consequently, the duty cycle of the switch SW31 changes according to the change tendency of the deviation Δi.

As described above, in the present embodiment, the control apparatus 30 performs the peak current mode control using the post-correction current detection value ILar that is calculated by subtracting the current correction value Ic from the current detection value ILr. Moreover, the control apparatus 30 sets the current correction value Ic to have: a local minimum value at each of a timing in the first period P1 during which the AC voltage Vac is positive and a timing in the second period P2 during which the AC voltage Vac is negative; and a local maximum value at a timing between the timings respectively in the first and second periods P1 and P2 at which it has the local minimum value. Consequently, the duty cycle of the switch SW31 is set according to the change tendency of the deviation Δi. As a result, it becomes possible to suppress increase in the full scale of the comparator 352 with respect to the command current IL* while suppressing distortion of the AC current Iac.

Modification of Fifth Embodiment

In the fifth embodiment, the control apparatus 30 may variably set the slope amount ms based on the AC voltage Vac as in the second embodiment. Moreover, in this case, the control apparatus 30 may set the current correction value Ic based on the variably-set slope amount ms as well as on the AC voltage Vac and the DC voltage Vdc.

Sixth Embodiment

An electric power conversion apparatus 100 according to the sixth embodiment has a similar configuration to the electric power conversion apparatus 100 according to the fifth embodiment. Therefore, only the differences therebetween will be mainly described hereinafter.

The electric power conversion apparatus 100 according to the sixth embodiment differs in circuit topology from the electric power conversion apparatus 100 according to the fifth embodiment. Specifically, unlike in the fifth embodiment, the electric power conversion apparatus 100 includes no half-bridge circuit in the present embodiment.

Figure 23:
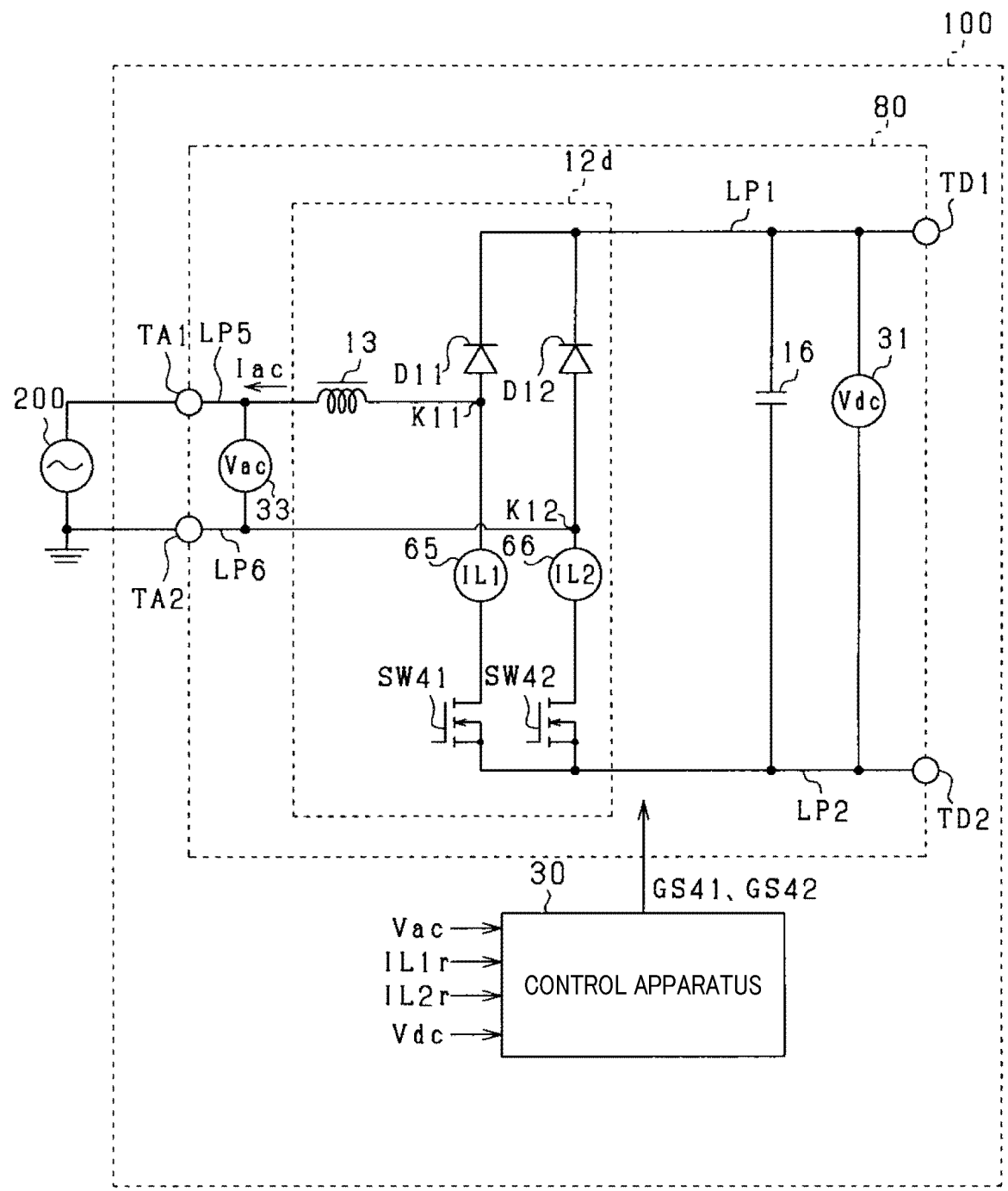
FIG. 23 is a configuration diagram of an electric power conversion apparatus according to a sixth embodiment.

FIG. 23 shows the overall configuration of the electric power conversion apparatus 100 according to the sixth embodiment.

As shown in FIG. 23, in the present embodiment, the first DC terminal TD1 is connected with a full-bridge circuit 12*d* via the first wiring LP1. Similarly, the second DC terminal TD2 is connected with the full-bridge circuit 12*d* via the second wiring LP2.

The full-bridge circuit 12*d* includes a first switch SW41, a second switch SW42, a first diode D11 and a second diode D12.

Each of the first and second switches SW41 and SW42 is implemented by a voltage-driven switch, more particularly by an N-channel MOSFET in the present embodiment.

The anode of the first diode D11 is connected with the drain of the first switch SW41. Similarly, the anode of the second diode D12 is connected with the drain of the second switch SW42. Moreover, each of the cathodes of the first and second diodes D11 and D12 is connected with the first wiring LP1, while each of the sources of the first and second switches SW41 and SW42 is connected with the second wiring LP2. In addition, each of the first and second switches SW41 and SW42 has a parasitic diode connected in antiparallel thereto.

A first junction point K11 between the first diode D11 and the first switch SW41 is connected with the first end of the fifth wiring LP5. Moreover, the second end of the fifth wiring LP5 is connected with the first AC terminal TAL. On the other hand, a second junction point K12 between the second diode D12 and the second switch SW42 is connected with the first end of the sixth wiring LP6. Moreover, the second end of the sixth wiring LP6 is connected with the second AC terminal TA2.

In the present embodiment, the full-bridge circuit 12*d* further includes a first current sensor 65 for detecting the reactor current IL during a first period P1 and a second current sensor 66 for detecting the reactor current IL during a second period P2.

The first current sensor 65 is provided in a wiring connecting the anode of the first diode D11 and the drain of the first switch SW41 so as to be located closer than the first junction point K11 to the drain of the first switch SW41. The first current sensor 65 detects current flowing through the first switch SW41 as a first current detection value IL1*r*.

Similarly, the second current sensor 66 is provided in a wiring connecting the anode of the second diode D12 and the drain of the second switch SW42 so as to be located closer than the second junction point K12 to the drain of the second switch SW42. The second current sensor 66 detects current flowing through the second switch SW42 as a second current detection value IL2*r*.

Figure 24:
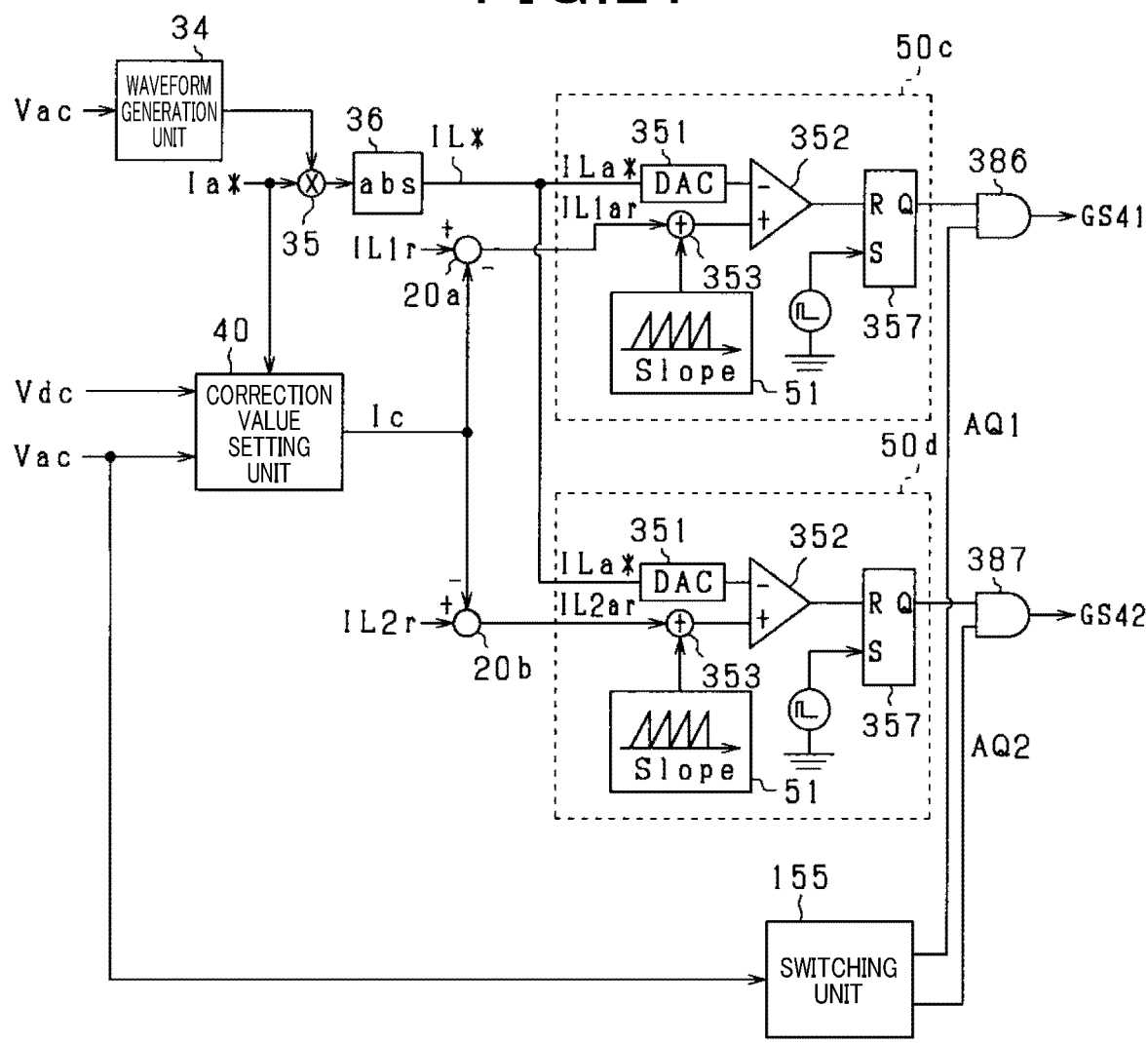
FIG. 24 is a functional block diagram of a control apparatus applied to the electric power conversion apparatus according to the sixth embodiment.

FIG. 24 shows the configuration of a control apparatus 30 according to the sixth embodiment. The control apparatus 30 is configured to control the AC-to-DC converter 80 of the electric power conversion apparatus 100 by peak current mode control.

As shown in FIG. 24, in the present embodiment, the control apparatus 30 includes a first current control unit 50*c*, a second current control unit 50*d* and a switching unit 155.

The first current control unit 50*c* operates the first switch SW41 through the peak current mode control, so as to control the first post-correction current detection value IL1*ar* to be in agreement with the command current IL* during the first period P1.

The second current control unit 50*d* operates the second switch SW 42 through the peak current mode control, so as to control the second post-correction current detection value IL2*ar* to be in agreement with the command current IL* during the second period P2.

In addition, the configurations of the first and second current control units 50*c* and 50*d* are similar to the configuration of the current control unit 50 in the previous embodiments. Therefore, further explanation of the first and second current control units 50*c* and 50*d* is omitted hereinafter.

The switching unit 155 switches the outputs of a first gate signal GS41 for operating the first switch SW41 and a second gate signal GS42 for operating the second switch SW42 according to the polarity of the AC voltage Vac. The switching unit 155 has output terminals respectively connected with a first input terminal of a first AND circuit 386 and a first input terminal of a second AND circuit 387. Moreover, a second input terminal of the first AND circuit 386 is connected with an output terminal of the first current control unit 50*c* while a second input terminal of the second AND circuit 387 is connected with an output terminal of the second current control unit 50*d*.

The switching unit 155 determines whether the AC voltage Vac is positive or negative. Moreover, when the AC voltage Vac is determined to be positive, the switching unit 155 sets a first switching signal AQ1 to be outputted to the first AND circuit 386 to a high level and a second switching signal AQ2 to be outputted to the second AND circuit 387 to a low level. In contrast, when the AC voltage Vac is determined to be negative, the switching unit 155 sets the first switching signal AQ1 to be outputted to the first AND circuit 386 to a low level and the second switching signal AQ2 to be outputted to the second AND circuit 387 to a high level.

The first AND circuit 386 has an output terminal connected with the gate of the first switch SW41 and outputs the first gate signal GS41 to the gate of the first switch SW41 via the output terminal. Similarly, the second AND circuit 387 has an output terminal connected with the gate of the second switch SW42 and outputs the second gate signal GS42 to the gate of the second switch SW42 via the output terminal.

For the first period P1 during which the AC voltage Vac is positive, the first switching signal AQ1 outputted from the switching unit 155 to the first AND circuit 386 is set to a high level and the second switching signal AQ2 outputted from the switching unit 155 to the second AND circuit 387 is set to a low level. Moreover, during the first period P1, the first post-correction current detection value IL1*ar*, which is calculated by the first correction unit 20*a* by subtracting the current correction value Ic from the first current detection value IL1*r*, is inputted to the first current control unit 50*c*. To control the first post-correction current detection value IL1*ar* to be in agreement with the command current IL*, the first gate signal GS41 outputted to the gate of the first switch SW41 is changed by the first current control unit 50*c* between a high level and a low level. Consequently, the first switch SW41 is operated through the peak current mode control performed by the first current control unit 50*c*.

For the second period P2 during which the AC voltage Vac is negative, the first switching signal AQ1 outputted from the switching unit 155 to the first AND circuit 386 is set to a low level and the second switching signal AQ2 outputted from the switching unit 155 to the second AND circuit 387 is set to a high level. Moreover, during the second period P2, the second post-correction current detection value IL2ar, which is calculated by the second correction unit 20b by subtracting the current correction value Ic from the second current detection value IL2r, is inputted to the second current control unit 50d. To control the second post-correction current detection value IL2ar to be in agreement with the command current IL*, the second gate signal GS42 outputted to the gate of the second switch SW42 is changed by the second current control unit 50d between a high level and a low level. Consequently, the second switch SW42 is operated through the peak current mode control performed by the second current control unit 50d.

During the first and second periods P1 and P2, the current correction value Ic changes so as to have a local maximum value at each of the zero-crossing timings of the AC voltage Vac and a local minimum value at each of the peak timings of the AC voltage Vac. Consequently, the duty cycles of the first and second switches SW41 and SW42 during the first and second periods P1 and P2 are set according to the change tendency of the deviation $\Delta i$.

According to the present embodiment, it is possible to achieve the same advantageous effects as achievable according to the fifth embodiment.

While the above particular embodiments and modifications have been shown and described, it will be understood by those skilled in the art that various further modifications, changes and improvements may be made without departing from the spirit of the present disclosure.

In the first embodiment, when the electric power conversion apparatus 100 converts the DC voltage Vdc into the AC voltage Vac, the harmonic correction value Ih may not necessarily be set by the equations (2) and (3). For example, in the case of the DC voltage Vdc being set to a fixed value, the harmonic correction value Ih may be set based only on the AC voltage Vac.

In the fifth embodiment, when the electric power conversion apparatus 100 converts the AC voltage Vac into the DC voltage Vdc, the harmonic correction value Ih may not necessarily be set by the equations (4) and (5). For example, in the case of the DC voltage Vdc being set to a fixed value, the harmonic correction value Ih may be set based only on the AC voltage Vac.

In the above-described embodiments and modifications, explanation is given taking the case of the power factor being equal to 1 as an example. However, the embodiments and modifications may also be applied to cases where the power factor is less than 1. In these cases, the waveform generation unit 34 may generate, according to the power factor, a reference waveform sin $\omega t$ that is offset in phase by a predetermined amount $\alpha$ from the AC voltage Vac. Moreover, the command current IL* may be set based on the generated reference waveform sin $\omega t$. That is, the command current IL* may be set according to the power factor. Furthermore, the deviation between the command current IL* set according to the power factor and the average value Iave of the reactor current IL may be calculated; then the harmonic correction value Ih may be set according to the calculated deviation.

In the above-described embodiments and modifications, the electric power conversion apparatus 100 may alternatively be configured to perform bidirectional electric power conversion between the AC voltage Vac and the DC voltage Vdc.

What is claimed is:

1. A control apparatus for an electric power conversion apparatus, the electric power conversion apparatus comprising a reactor and a drive switch and being configured to convert one of an AC voltage and a DC voltage into the other of the AC voltage and the DC voltage, the control apparatus comprising:
a detection value acquisition unit configured to acquire a current detection value, the current detection value being a detected value of reactor current flowing through the reactor of the electric power conversion apparatus;
an AC voltage acquisition unit configured to acquire the AC voltage;
a command value calculation unit configured to calculate, based on the AC voltage acquired by the AC voltage acquisition unit, a command value of the reactor current that has a sinusoidal waveform;
a correction value setting unit configured to set a correction value based on the AC voltage acquired by the AC voltage acquisition unit;
a correction unit configured to calculate a post-correction current detection value by subtracting the correction value set by the correction value setting unit from the current detection value acquired by the detection value acquisition unit; and
a current control unit configured to operate the drive switch of the electric power conversion apparatus through peak current mode control, thereby controlling the post-correction current detection value calculated by the correction unit to be in agreement with the command value calculated by the command value calculation unit.

2. The control apparatus as set forth in claim 1, further comprising a slope-amount setting unit configured to variably set a slope of a slope compensation signal,
wherein
the correction value setting unit is configured to set the correction value based on the slope of the slope compensation signal set by the slope-amount setting unit as well as on the AC voltage acquired by the AC voltage acquisition unit, and
the current control unit is configured to operate the drive switch through the peak current mode control, thereby controlling a slope-compensated post-correction current detection value, which is calculated by adding the slope compensation signal to the post-correction current detection value, to be in agreement with the command value.

3. The control apparatus as set forth in claim 1, wherein the electric power conversion apparatus is configured to convert the DC voltage into the AC voltage, and
the correction value setting unit is configured to set the correction value to have: a local maximum value at each of a timing in a first period during which the AC voltage is positive and a timing in a second period during which the AC voltage is negative; and a local minimum value at a timing between the timings respectively in the first and second periods at which it has the local maximum value,
the first and second periods together constituting one period of the AC voltage.

4. The control apparatus as set forth in claim 1, wherein the electric power conversion apparatus is configured to convert the AC voltage into the DC voltage, and
the correction value setting unit is configured to set the correction value to have: a local minimum value at each of a timing in a first period during which the AC voltage is positive and a timing in a second period during which the AC voltage is negative; and a local maximum value at a timing between the timings respectively in the first and second periods at which it has the local minimum value, the first and second periods together constituting one period of the AC voltage.

* * * * *